US008749297B2

(12) United States Patent
Sutandi et al.

(10) Patent No.: US 8,749,297 B2
(45) Date of Patent: Jun. 10, 2014

(54) HIGH-VOLTAGE SWITCH USING THREE FETS

(71) Applicant: Synopsys, Inc., Mountain View, CA (US)

(72) Inventors: Agustinus Sutandi, Issaquah, WA (US); Yanyi L. Wong, Seattle, WA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 13/769,117

(22) Filed: Feb. 15, 2013

(65) Prior Publication Data

US 2013/0162326 A1 Jun. 27, 2013

Related U.S. Application Data

(62) Division of application No. 13/326,162, filed on Dec. 14, 2011, now Pat. No. 8,400,208, which is a division of application No. 12/143,133, filed on Jun. 20, 2008, now Pat. No. 8,098,088.

(60) Provisional application No. 60/999,465, filed on Oct. 16, 2007, provisional application No. 61/003,221, filed on Nov. 15, 2007.

(51) Int. Cl.
 *H03K 17/687* (2006.01)
(52) U.S. Cl.
 USPC ............................................ 327/436; 327/437
(58) Field of Classification Search
 USPC ...................... 327/419, 427, 434, 436, 437
 See application file for complete search history.

(56) References Cited

U.S. PATENT DOCUMENTS

| 5,245,230 | A | * | 9/1993 | Ohri et al. | 327/379 |
|---|---|---|---|---|---|
| 6,370,071 | B1 | * | 4/2002 | Lall et al. | 365/205 |
| 7,429,873 | B2 | * | 9/2008 | Peschke | 326/81 |
| 7,580,311 | B2 | * | 8/2009 | Pesavento | 365/226 |
| 7,663,423 | B1 | * | 2/2010 | Cheng | 327/333 |
| 8,044,801 | B1 | * | 10/2011 | Hyde et al. | 340/572.1 |
| 8,098,088 | B1 | * | 1/2012 | Sutandi et al. | 327/427 |
| 8,400,208 | B2 | * | 3/2013 | Sutandi et al. | 327/427 |
| 8,437,196 | B2 | * | 5/2013 | Lo Giudice et al. | 365/185.21 |
| 2007/0159373 | A1 | * | 7/2007 | Peschke | 341/156 |
| 2007/0290744 | A1 | * | 12/2007 | Adachi et al. | 330/51 |
| 2013/0002149 | A1 | * | 1/2013 | Mott et al. | 315/161 |

* cited by examiner

*Primary Examiner* — William Hernandez
(74) *Attorney, Agent, or Firm* — Fenwick & West LLP

(57) ABSTRACT

Switch circuits are disclosed, for providing a single-ended and a differentially switched high-voltage output signals by switching a high supply voltage in response to at least one logic-level control signal. The switch that provides the single-ended switched high-voltage output signal includes a chain of at least three serially coupled field effect transistors (FETs). The chain receives the high supply voltage and switches it to output the high-voltage output signal. The switch that provides the differentially switched high-voltage output signal includes two differentially coupled chains, each having at least three serially coupled FETs. The chains receive the high supply voltage and switch it to output the differential high-voltage output signal. A control/bias circuit provides a control voltage to at least one of the FETs in the chains, responsive to the control signal.

19 Claims, 22 Drawing Sheets

SINGLE-ENDED HV SWITCH

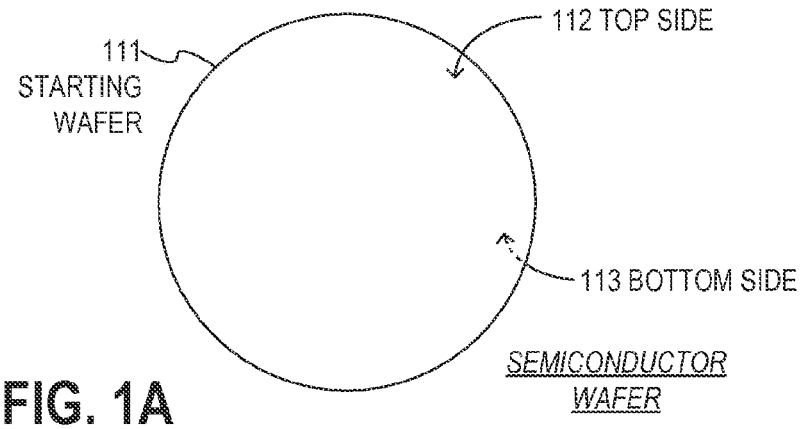
FIG. 1A — SEMICONDUCTOR WAFER
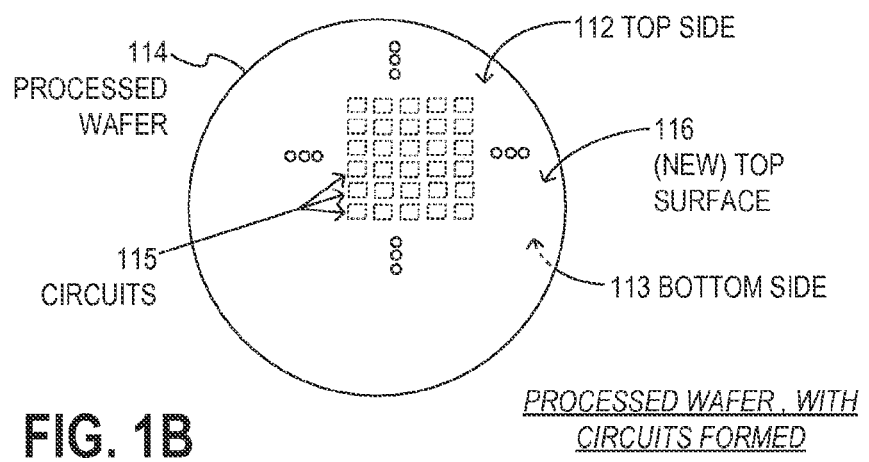
FIG. 1B — PROCESSED WAFER, WITH CIRCUITS FORMED
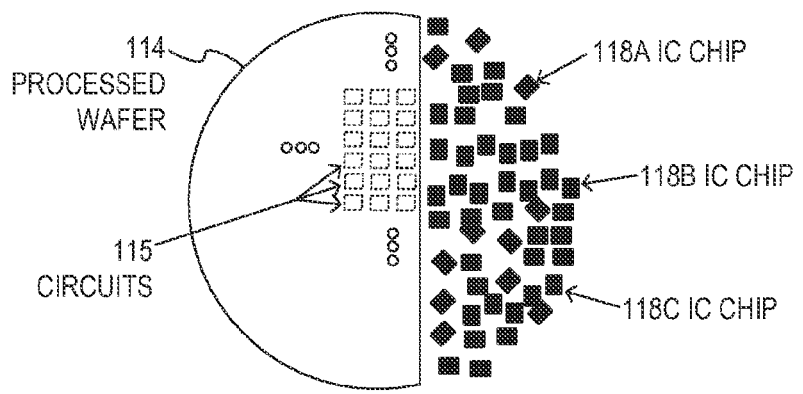
FIG. 1C — WAFER BEING SEPARATED INTO INTEGRATED CIRCUIT (IC) CHIPS

MEMORY CIRCUIT INCORPORATING HV SWITCHES

300B

| L. L. INPUT | | VOUT |
|---|---|---|
| ON | PULLDN | |
| 0 | 1 | VCOM |
| 1 | 0 | VTUN |

*TRUTH TABLE OF SINGLE-ENDED HV SWITCH*

FIG. 3B

CONTROL/BIAS CIRCUIT B OF
SINGLE-ENDED HV SWITCH #1

SINGLE-ENDED HV SWITCH #3

*NODE VOLTAGES V. TIME IN SINGLE-ENDED HV SWITCH*

*DIGITAL CONTROL SIGNALS TIMING IN SINGLE-ENDED HV SWITCH DURING START-UP*

900B

| L.L. INPUT | VOUT | $\overline{\text{VOUT}}$ |
|---|---|---|
| 0 | VCOM | VTUN |
| 1 | VTUN | VCOM |

*TRUTH TABLE OF DIFFERENTIAL HV SWITCH*

FIG. 9B

*CONTROL/BIAS CIRCUIT OF DIFFERENTIAL HV SWITCH #1*

*PULL-DOWN BLOCK OF DIFFERENTIAL HV SWITCH #1*

CONTROL/BIAS CIRCUIT OF
DIFFERENTIAL HV SWITCH #2

PULL-DOWN BLOCK OF
DIFFERENTIAL HV SWITCH #2

*SUPPLY VOLTAGES V. TIME IN DIFFERENTIAL HV SWITCH*

*DIGITAL CONTROL SIGNALS TIMING IN DIFFERENTIAL HV SWITCH*

HIGH-VOLTAGE SWITCH USING THREE FETS

CROSS-REFERENCE TO RELATED APPLICATIONS

This application is a divisional application claiming benefit of U.S. patent application Ser. No. 13/326,162, filed on Dec. 14, 2011, which is a divisional application claiming benefit of U.S. patent application Ser. No. 12/143,133, filed on Jun. 20, 2008, now issued as U.S. Pat. No. 8,098,088, which claims the benefit of U.S. Provisional Patent Application Ser. No. 60/999,465, filed on Oct. 16, 2007 and U.S. Provisional Patent Application Ser. No. 61/003,221, filed on Nov. 15, 2007, which are incorporated by reference herein in their entirety.

BACKGROUND

Memory devices are electronic devices arranged to store electrical data. A plurality of memory elements can be combined in various arrangements in order to store multiple bits arranged in words or other combinations. Various electronic circuits including semiconductor devices, such as transistors, are used as memory elements. Memory elements may be classified in two main categories: volatile and nonvolatile. Volatile memory loses any data as soon as the system is turned off, thus, it requires constant power to remain viable. Most types of random access memory (RAM) fall into this category. NVM device does not lose its data when the power of the device is turned off.

Certain types of NVM devices, circuits employing floating-gate devices, high-voltage drivers and other circuits fabricated in logic CMOS require relatively high-voltages (e.g., about 20 V in a 5 V CMOS process). For example, in NVM devices, high-voltages are often used by circuits that program and erase information stored on the floating gates, and on-chip charge pumps are used for the most part to generate these high-voltages. In all these circuits, switches are required to selectively apply the high-voltages to specific circuit elements.

BRIEF SUMMARY

Switch circuits are disclosed, for providing high-voltage switching in a low-voltage CMOS process. The switch circuits according to embodiments can provide a single-ended and a differentially switched high-voltage output signal by switching a high supply voltage in response to at least one logic-level control signal.

The switch circuit that provides the single-ended switched high-voltage output signal includes a chain of at least three serially coupled field effect transistors (FETs). The chain receives the high supply voltage and switches it to output the high-voltage output signal.

The switch circuit that provides the differentially switched high-voltage output signal includes two differentially coupled chains. Each of them includes at least three serially coupled FETs. The chains receive the high supply voltage and switch it to output the differential high-voltage output signal.

A control/bias circuit provides a control voltage to at least one of the FETs in the chains, responsive to the control signal.

These and other features and advantages of the invention will be better understood from the specification of the invention, which includes the following Detailed Description and accompanying Drawings.

BRIEF DESCRIPTION OF THE DRAWINGS

The following Detailed Description proceeds with reference to the accompanying Drawings.

FIGS. 1A, 1B, and 1C are snapshots of steps in methods for preparing integrated circuit chips from a silicon wafer according to embodiments.

FIG. 3B is a truth table showing control conditions for the single-ended high-voltage switch of FIG. 3A according to embodiments.

FIG. 9B is a truth table showing operational conditions for the differential high-voltage switch of FIG. 9A according to embodiments.

DETAILED DESCRIPTION

Figure 2:
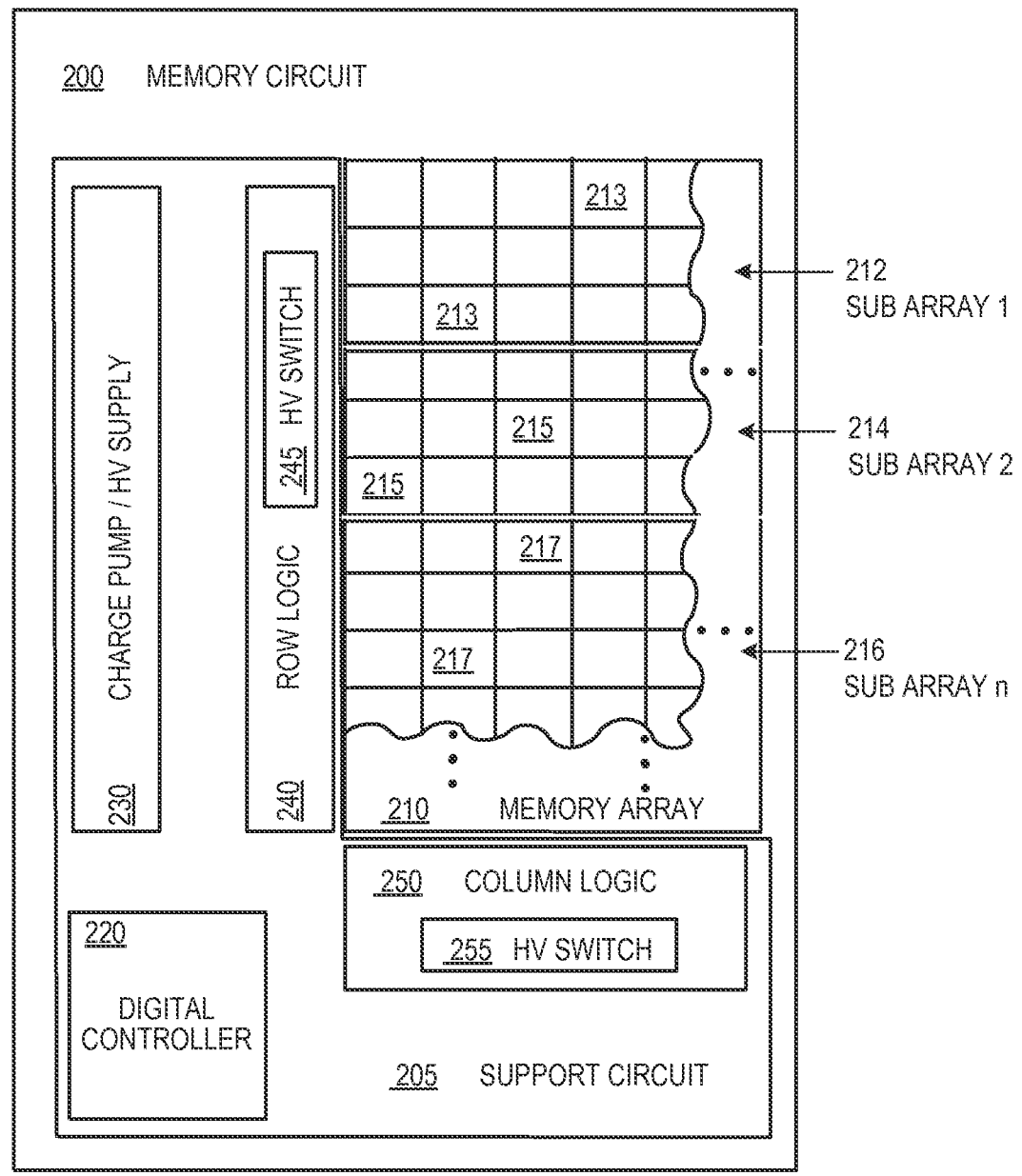
FIG. 2 is a block diagram illustrating an implementation of a memory device incorporating high-voltage switches according to an embodiment.

The present invention is now described. While it is disclosed in its preferred form, the specific embodiments of the invention as disclosed herein and illustrated in the drawings are not to be considered in a limiting sense. Rather, these embodiments are provided so that this disclosure will be thorough and complete, and will fully convey the scope of the invention to those skilled in the art. Indeed, it should be readily apparent in view of the present description that the invention might be modified in numerous ways. Among other things, the present invention may be embodied as devices, methods, software, and so on. Accordingly, the present invention may take the form of an entirely hardware embodiment, an entirely software embodiment, an entirely firmware embodiment, or an embodiment combining aspects of the above. This description is, therefore, not to be taken in a limiting sense.

As it has been mentioned, the present invention provides for high-voltage switches using three cascoded FETs. The invention is now described in more detail.

Integrated circuits are made according to embodiments, using semiconductor fabrication methods. A very high-level overview is now provided.

FIG. 1A shows starting wafer 111. Wafer 111 is typically made of semiconductor material, such as silicon. The silicon is sometimes doped with p-type or n-type impurities to improve its electronic properties, as desired for its operation as a substrate. Wafer 111 has a top side 112, and a bottom side 113 opposite to top side 112. Typically, circuits are formed on top side 112, as described below.

FIG. 1B shows a processed wafer 114, which has been derived from wafer 111, after circuits 115 have been formed according to embodiments. Only a few such circuits 115 are shown in FIG. 1B, but that is only by way of illustration. In actual practice, as many such circuits 115 are formed on wafer 111 as possible, to increase yield per wafer, and thus reduce the cost of each resulting unit.

Circuits 115 are formed by semiconductor manufacturing machines, often operated by foundries. It is worthwhile to note that circuits 115 are formed on the original surface of top side 112, both beneath the level of the original surface and above it. In addition, other materials are then deposited on top side 112. Accordingly, wafer 114 acquires a new top surface 116, which is elevated compared to the original surface.

FIG. 1C shows that wafer 114 of FIG. 1B is separated afterwards into individual chips 118A, 118B, 118C, etc., according to embodiments. This separating is also called singulating. Singulation can be performed by dicing processed wafer 114, or etching it, etc. Each of individual chips 118A, 118B, 118C, typically contains one of circuits 115, and is thus called an integrated circuit (IC) chip. The size of each IC chip is thus determined in part by the size of circuits 115.

FIG. 2 is a block diagram of an example NVM circuit 200 that incorporates high-voltage switches according to embodiments. The example NVM circuit 200 includes memory array 210 and support circuit 205. Memory array 210 may be implemented in the form of multiple memory sub-arrays 212, 214, and 216, each sub-array comprising cells that are addressable in terms of a row and a column.

Memory sub-arrays 212, 214, and 216 commonly include a number of cells e.g., cells 213, 215, and 217, which store the data to be consumed by operational components. Memory cells 213, 215, and 217 may store electrical charges that can represent digital data. A memory cell without stored electrical charge has digital datum of "0". To store a "1", charges are stored on a floating gate. This operation requires energy from the charge pump/high voltage (HV) supply 230.

Support circuit 205 includes digital controller 220, charge pump/HV supply 230, row logic 240, and column logic 250. Row logic 240 includes high-voltage (HV) switch 245, while column logic 250 includes HV switch 255.

HV switches 245 and 255 are used to pass a VTUN voltage to a tunneling device. VTUN can be up to three times higher than a breakdown voltage of a p+/n-well diode of the NVM circuit 200. HV switches provide VTUN for tunneling to the tunneling junctions of the NVM cells without exposing any device to voltages that are larger than the breakdown voltage of the device.

Digital controller 220 is arranged to provide the necessary data processing and control signal manipulation capability for write and read operations. It can address individual cells of memory array 210 during write and read operations. It also manages the operation of charge pump/HV supply 230, and HV switches 245 and 255 required for write and read operations.

Charge pump/HV supply 230 is an electronic circuit that uses capacitors as energy storage elements to convert low voltages into higher voltage outputs. High voltages are needed for operating the NVM. Charge pump/HV supply 230 provides supply voltages to row logic 240 and column logic 250.

Row logic 240 and column logic 250 circuits are responsible for selecting a specific cell of the memory array for write and read operations.

Figure 3A:
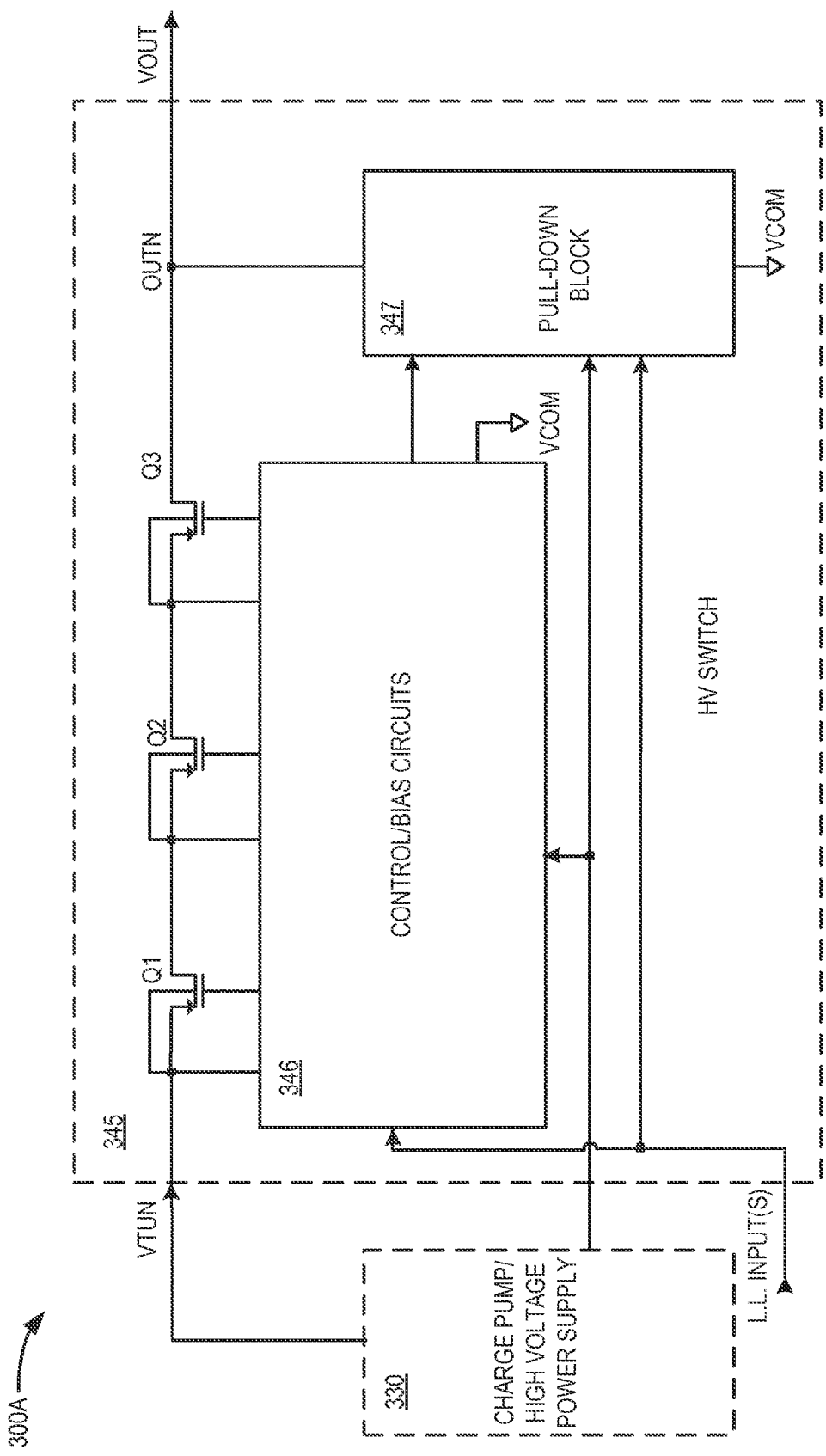
FIG. 3A is a block diagram illustrating an implementation of a single-ended high-voltage switch according to embodiments.

FIG. 3A is block diagram 300A that illustrates a general implementation of single-ended HV switch 345 according to embodiments.

Single-ended HV switch 345 outputs high-voltage signal VOUT at output node OUTN by switching high supply voltage VTUN in response to at least one logic-level control signal. HV switch 345 includes a chain of three serially coupled FETs, Q1, Q2, and Q3. The chain receives high supply voltage VTUN from the charge pump/HV power supply and switches it to output the high-voltage output signal VOUT. Control/bias circuits 346 provide control voltages to the gates and sources of FETs Q1, Q2, and Q3 in the chain.

Bias voltages and their timings are functions of the received logic-level control signals. Pull-down block 347 is coupled to output node OUTN in order to pull down VOUT to VCOM in response to control signal PULLDN (not shown).

FIG. 3B is truth table 300B that shows control conditions for the single-ended HV switch of FIG. 3A according to embodiments. Control signal ON is one of the logic-level control signals operating HV switch 345, while control signal PULLDN is an internally generated complement of control signal ON. As truth table 300B illustrates, HV switch 345 outputs VTUN when control signal ON is true (logic "1") and outputs VCOM when control signal ON is false (logic "0"). It should be noted that HV switch 345 receives two additional logic-level control signals: enable control signal ENA, and reset control signal RST. Their functions will be described further down in the text.

Figure 4A:
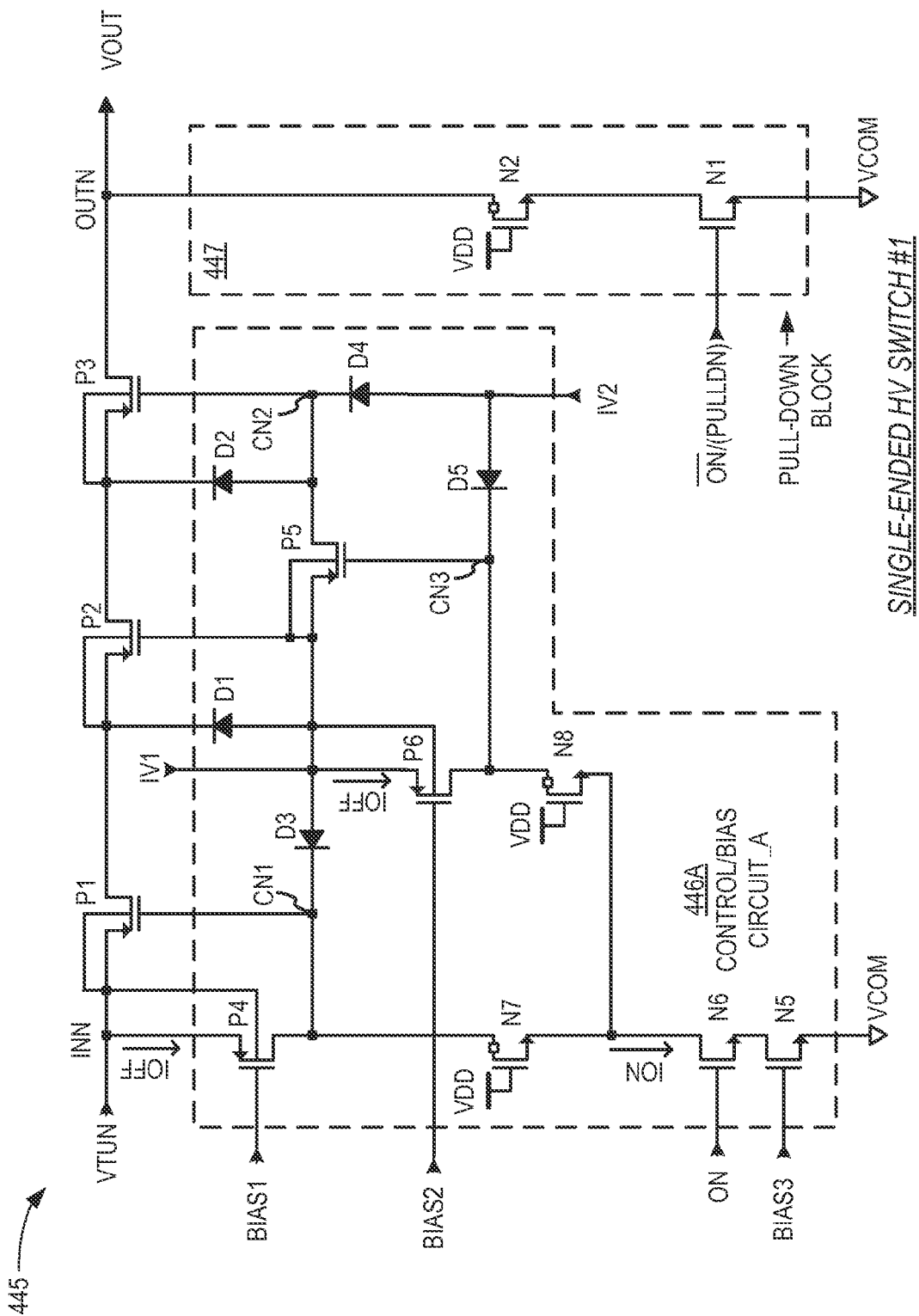
FIG. 4A is an electrical schematic diagram illustrating an implementation of the single-ended high-voltage switch of FIG. 3A according to an embodiment.
Figure 4B:
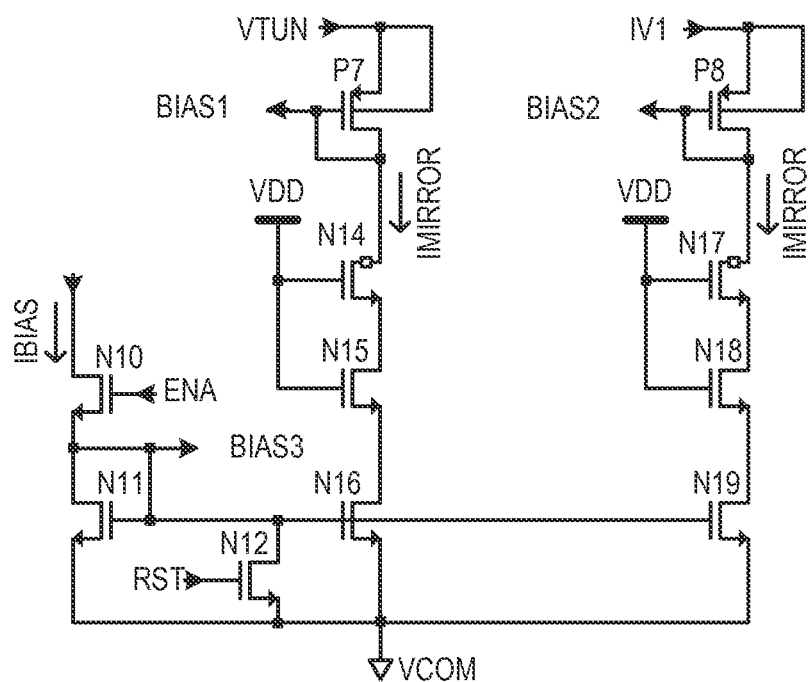
FIG. 4B is an electrical schematic diagram illustrating an implementation of a control/bias circuit for the single-ended high-voltage switch of FIG. 4A according to an embodiment.

FIGS. 4A and 4B are electrical schematic diagrams that illustrate single-ended HV switch #1, a possible implementation of HV switch 345 of FIG. 3A according to an embodiment. In this embodiment, single-ended HV switch 445 provides a switched high-voltage output signal VOUT in response to a logic-level input signal.

HV switch #1 includes a chain of three serially coupled pFETs, P1, P2, and P3, control/bias circuit_A 446A, control/bias circuit_B 446B, and pull-down block 447.

The chain is formed by coupling a drain of pFET P1 to a well and a source of pFET P2, coupling a drain of pFET P2 to a source and a well of pFET P3, and coupling a drain of pFET P3 to output node OUTN. The source and the well of pFET P1 is coupled to a source of the high supply voltage VTUN.

A gate of pFET P1 is coupled to control node CN1 of control/bias circuit_A 446A to receive a control voltage that is substantially equal to high supply voltage VTUN when the control signal ON is false, and to a different control voltage that is substantially equal to first intermediate supply voltage IV1 when control signal ON is true.

A gate of pFET P2 is coupled to receive first intermediate supply voltage IV1.

A gate of pFET P3 is coupled to control node CN2. A bias voltage on control node CN2 is substantially equal to second intermediate supply voltage IV2 when control signal ON is false, and to first intermediate supply voltage IV1 when the control signal ON is true.

pFET diodes D1 and D2 of control/bias circuit_A 446A are coupled parallel with the source and the gate terminals of pFET P2 and pFET P3, respectively. Anodes of the diodes are coupled to the gates of the pFETs.

Control/bias circuit_A 446A further includes nFET N5 disposed between a source of nFET N6 and VCOM, and a gate of nFET N5 is biased by bias voltage source BIAS3. A gate of nFET N6 is coupled to logic-level input ON to operate HV switch #1 445. An LDMOS N7 is disposed between a drain of nFET N6 and control node CN1. A pFET is configured as diode D3 with its cathode coupled to control node CN1 and its anode coupled to the anode of diode D1. pFET P4 is configured with its source and well coupled to high supply voltage VTUN, its gate coupled to BIAS1 (a bias voltage set at Vtp below VTUN), and its drain coupled to control node CN1, where Vtp is a threshold voltage of a pFET device.

Pull-down block 447 includes LDMOS N2 configured with its drain coupled to node OUTN, its source coupled to the drain of nFET N1, and its gate coupled to VDD. A source of nFET N1 is coupled to voltage source VCOM and its gate coupled to logic-level input PULLDN.

In accordance to this embodiment, the following voltages may be used: high supply voltage VTUN equals to 24 V, intermediate supply voltage IV1 equals to 16 V, intermediate supply voltage IV2 equals to 8 V, VDD equals to 5 V, and VCOM equals to 0 V.

Voltage values for intermediate supply voltages can be modified without adverse effects on the operation of the circuits. The value of first intermediate supply voltage IV1 can be between five sixth and one-half of a value of the high supply voltage. The value of the second intermediate supply voltage IV2 can be between one half and one sixth of a value of the high supply voltage. The value of the VDD (a third intermediate supply voltage) can be between 7 V and 3 V. The value of the VCOM voltage can be between 5 V and 0 V.

FIG. 4B is an electrical schematic diagram that illustrates a possible implementation of control/bias circuit_B 446B for single-ended HV switch 445 of FIG. 4A according to an embodiment. Control/bias circuit_B 446B is used to generate the bias voltages BIAS1, BIAS2, and BIAS3 for HV switch 445. Bias current IBIAS (its source not shown) is typically ~100 nA. When control signal ENA goes high during a start-up phase, current IBIAS begins to charge node BIAS3. This voltage will increase until nFET N11 begins to turn on and can sink the entire IBIAS current. This will also turn on nFET N16 and nFET N19, they mirror current IBIAS, as currents IMIRRORs flowing from voltage supplies VTUN and IV1, respectively. Once LDMOS N14 and LDMOS N17 begin to turn on, bias voltages BIAS1 and BIAS2 start to drop turning on P7 and P8 until they can source the entire IMIRROR current. These three bias voltages, BIAS1, BIAS2, and BIAS3, are then used to set bias currents within HV switch 445. Values of bias voltages, BIAS1, BIAS2, and BIAS3 are approximately VTUN−Vtp, IV1−Vtp, and VCOM+Vtn, respectively, where Vtn is a threshold voltage of an nFET device.

When HV switch 445 is off, the current path (through nFET N5 and nFET N6) is disabled. Bias voltages BIAS1 and BIAS2 are sufficient to provide a small bias current, IOFF, from VTUN to CN1 and from IV1 to CN3, such that IOFF>ION. The voltages at control nodes CN1 and CN3 are pulled up to VTUN and IV1, respectively. Since voltage at CN1 is equal to VTUN, pFET P1 is turned off. As long as this is the case, the voltage at the source of pFET P2 is substantially IV1. Thus, pFET P1 has VTUN at its source and gate, and substantially IV1 at its drain. When VTUN is 24 V, pFET P1 will have less than 8 V across gate to drain and drain to source. pFET P2 has IV1 at its gate and IV1 at its source, hence it is off pFET P5 is also off since its gate and source are at IV1 Thus, the voltages at CN2 and the source of pFET P3 are substantially IV2. For configurations where VTUN is less than 24 V, pFET P2 will have less than 8 V across drain to source and less than 8 V across gate to drain. Since the voltage at node VOUT is ~0 V, pFET P3 has IV2 at its source, IV2 at its gate, and 0 V at its drain. Thus, pFET P3 will have less than 8 V across drain to source and less than 8 V across gate to drain. The above described voltage distribution is representative of an HV switch that is made using a 5 V CMOS process.

When HV switch 445 is on, current paths from CN1 and CN3 are enabled through LDMOS N7−nFET N6−nFET N5 and LDMOS N8−nFET N6−nFET N5, respectively. The voltages at BIAS1, BIAS2, and BIAS3 are set to ensure that ION>2 IOFF. As long as ION is larger than 2 IOFF, the voltages at control nodes CN1 and CN3 fall. Diodes D3 and D5 prevent control nodes CN1 and CN3 from falling below IV1−Vtp, and IV2−Vtp, respectively. The voltages at control nodes CN1 and CN3 turn on pFET P1 and pFET P5, respectively. pFET P5 sets the voltage at control node CN2 to IV1. The voltage at the source of pFET P2 is set to VTUN through pFET PI. This, in turn, sets voltages at the source of pFET P3 and VOUT to VTUN through pFET P2 and pFET P3, since the pull-down path of OUTN node to VCOM is disabled, i.e., PULLDN is equal to 0 V.

Present circuit configuration assures that when VTUN is less than 24 V, all pFETs are subjected to less than 8 V across their gate to drain/source and to less than 8 V across their drain to source.

Figure 5A:
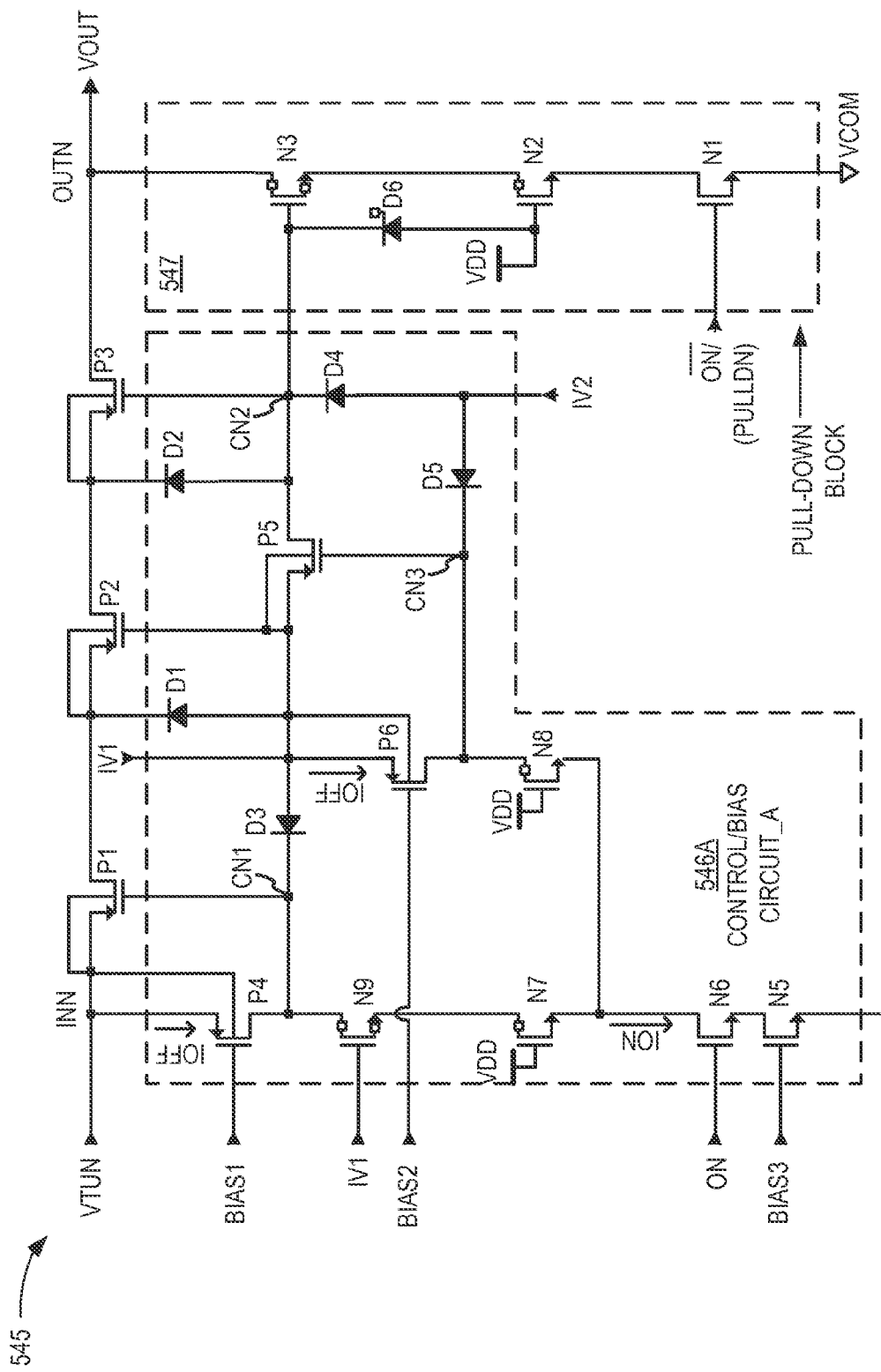
FIG. 5A is an electrical schematic diagram illustrating another implementation of the single-ended high-voltage switch of FIG. 3A according to an embodiment.
Figure 5B:
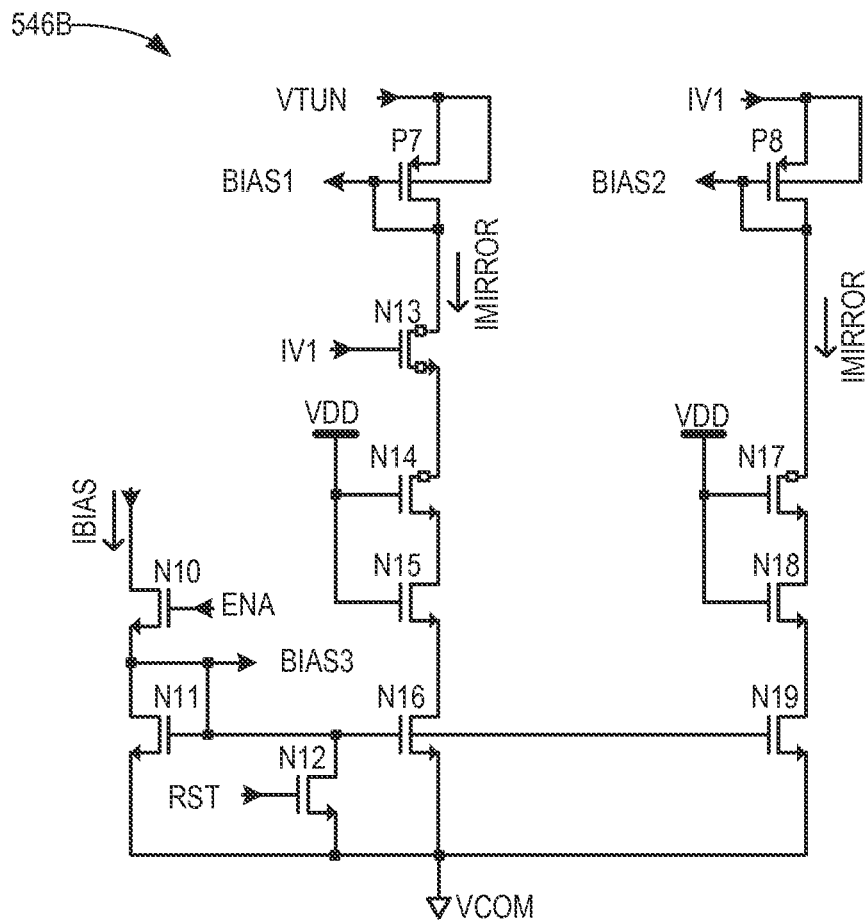
FIG. 5B is an electrical schematic diagram illustrating an implementation of a control/bias circuit for the single-ended high-voltage switch of FIG. 5A according to an embodiment.

FIGS. 5A and 5B are electrical schematic diagrams that illustrate single-ended HV switch #2 as another possible implementation of HV switch 345 of FIG. 3A according to an embodiment. In this embodiment, single-ended HV switch #2 545/546 provides a switched high-voltage output signal VOUT in response to a logic-level input signal.

HV switch #2 545/546 is functionally identical to HV switch #1 445/446 of FIGS. 4A and 4B, while structurally (circuit-wise) there are four notable differences between the two switches. HV switch #2 545/546 includes three additional high-voltage nFET devices to make the circuit more robust against high-voltage breakdown.

SLDMOS N9 is inserted between the drain of LDMOS N7 and the drain of pFET P4. A drain of SLDMOS N9 is coupled to the drain of pFET P4, its source is coupled to the drain of LDMOS N7, while its gate is coupled to receive intermediate supply voltage IV1.

SLDMOS N3 is inserted between the drain of LDMOS N2 and output node OUTN. A drain of SLDMOS N3 is coupled to output node OUTN, its source is coupled to the drain of LDMOS N2, while its gate is coupled to control node CN2.

An LDMOS is configured as diode D6 with its gate and source coupled to form an anode, while its drain acts as a cathode. The cathode of D6 is coupled to the gate of SLDMOS N3 and the anode of D6 is coupled to VDD.

SLDMOS N13 is inserted between the drain of LDMOS N14 and the drain of pFET P7. A drain of SLDMOS N13 is coupled to the drain of pFET P7, its source is coupled to the drain of LDMOS N14, while its gate is coupled to receive intermediate supply voltage IV1.

Figure 6A:
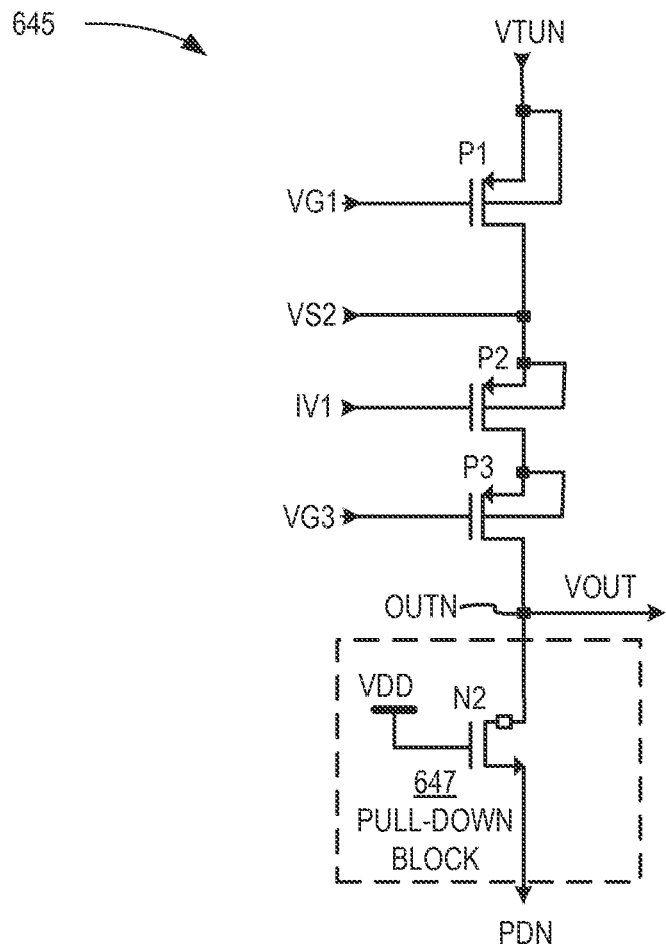
FIG. 6A is an electrical schematic diagram illustrating an implementation of a core circuit of yet another single-ended high-voltage switch according to an embodiment.
Figure 6B:
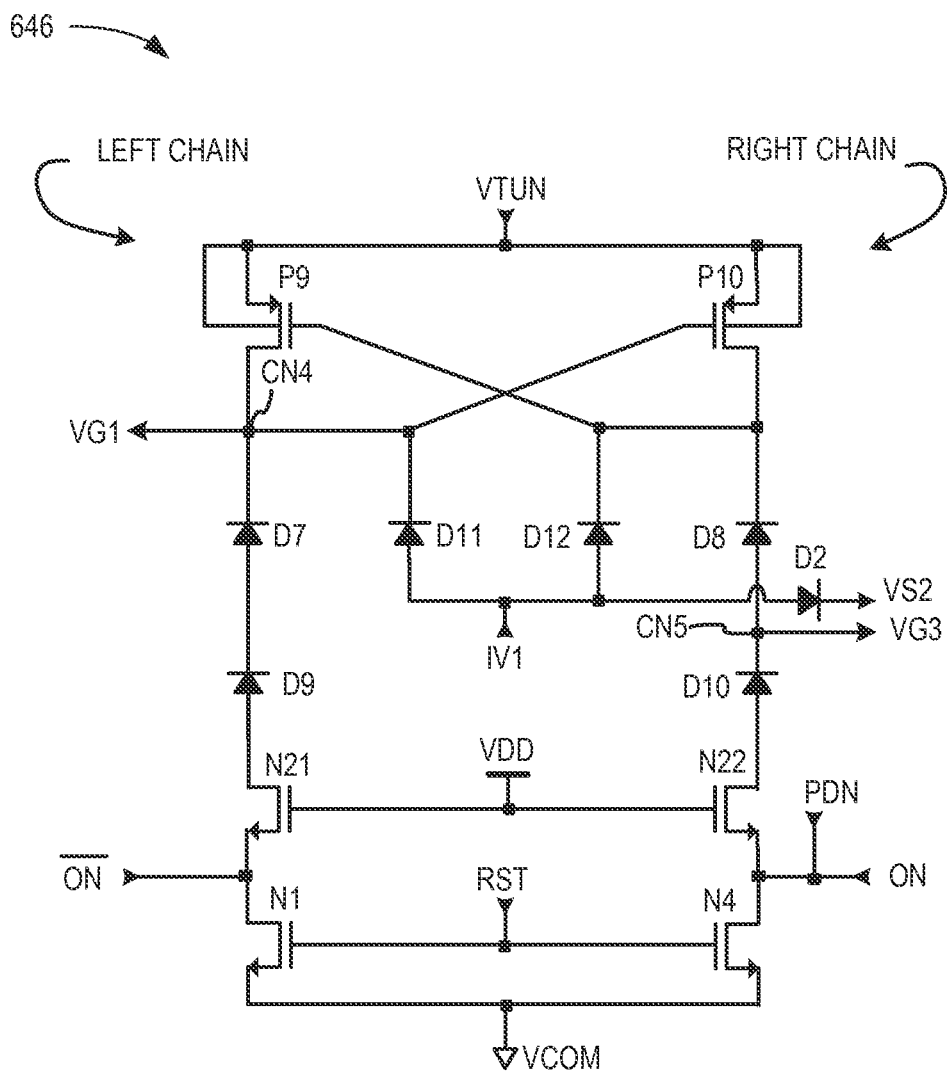
FIG. 6B is an electrical schematic diagram illustrating an implementation of a control/bias circuit for the single-ended high-voltage switch of FIG. 6A according to an embodiment.

FIGS. 6A and 6B are electrical schematic diagrams 645 and 646 that illustrate an implementation of single-ended HV switch #3 according to an embodiment.

HV switch #3 includes a chain of three serially coupled pFETs, P1, P2, and P3, control/bias circuit 646, and pull-down block 647.

The chain is formed by coupling a drain of pFET P1 to a well and a source of pFET P2, coupling a drain of pFET P2 to a source and a well of pFET P3, and coupling a drain of pFET P3 to output node OUTN. The source and the well of pFET P1 are coupled to receive high supply voltage VTUN.

The gate of pFET P1 is coupled to control node CN4 of control/bias circuit 646 to receive a control voltage VG1 that is substantially equal to the high supply voltage VTUN when the control signal ON is false or receive a control voltage substantially equal to first intermediate supply voltage IV1 when control signal ON is true.

The gate of pFET P2 is coupled to receive the first intermediate supply voltage IV1, the source of pFET P2 is coupled to receive bias voltage VS2.

The gate of pFET P3 is coupled to control node CN5 of control/bias circuit 646 to receive bias voltage VG3. Bias voltage VG3 is substantially equal to $V_{Z10}$ when the control signal ON is false or VTUN-$V_{Z8}$ when the control signal ON is true, where $V_{Z10}$ and $V_{Z8}$ are breakdown voltages of Zener diodes D10 and D8, respectively.

Pull-down block 647 is coupled to output node OUTN in order to pull down VOUT to VCOM via nFET N4 of FIG. 6B when control signal ON is false. Pull-down block 647 includes LDMOS N2, the drain of LDMOS N2 is coupled to output node OUTN, and its source is coupled to pull-down node PDN.

FIG. 6B is an electrical schematic diagram that illustrates an implementation of control/bias circuit 646 for single-ended HV switch #3 of FIG. 6A according to an embodiment.

Control/bias circuit 646 includes two differentially coupled chains, a left, and a right chain, forming a latch. Each chain is configured from serially coupled FETs, where some of the FETs are configured as FET diodes. The chains receive the high supply voltage VTUN and divide it to specific bias voltages. Control/bias circuit 646 operates under the control of logic-level input signals, i.e., control signals ON, $\overline{ON}$ and RST.

The left chain includes pFET P9, a source and a well of pFET P9 are coupled to receive the high supply voltage VTUN, its gate is coupled to a drain of pFET P10 in the right chain. Diode D7 is disposed between pFET P9 and diode D9, a cathode of diode D7 is coupled to a drain of pFET P9. The drain of pFET P9 is also coupled to the gate of pFET P1 of FIG. 6A to provide a bias voltage. Diode D9 is disposed between diode D7 and nFET N21, a cathode of diode D9 is coupled to an anode of diode D7. nFET N21 has its drain coupled to an anode of diode D9, its gate is coupled to receive a voltage from voltage supply VDD. nFET N1 has its drain coupled to a source of nFET N21 and it is also coupled to receive control signal $\overline{ON}$, a gate of nFET N1 is coupled to receive control signal RST, and a source of nFET N1 is coupled to VCOM. Diode D11 has its cathode coupled to the drain of pFET P9 and its anode is coupled to receive first intermediate voltage IV1.

The right chain includes pFET P10, a source and a well of pFET P10 are coupled to receive the high supply voltage VTUN, and its gate is coupled to the drain of pFET P9 in the right chain. Diode D8 is disposed between pFET P10 and diode D10, a cathode of diode D8 is coupled to the drain of pFET P10. Diode D10 is disposed between diode D8 and nFET N22, a cathode of diode D10 is coupled to an anode of diode D8. The cathode of D10 is also coupled to the gate of pFET P3 of FIG. 6A to provide a bias voltage. nFET N22 has its drain coupled to an anode of diode D10, its gate is coupled to receive a voltage from voltage supply VDD. nFET N4 has its drain coupled to a source of nFET N22 at pull-down node PDN. The drain of nFET N4 is also coupled to receive control signal ON. A gate of nFET N4 is coupled to receive control signal RST, and a source of nFET N4 is coupled to VCOM. Diode D12 has its cathode coupled to the drain of pFET P10 and its anode is coupled to the first intermediate voltage source IV1. Diode D2 has its anode coupled to the first intermediate voltage source IV1, its cathode is coupled to the source of pFET P2 of FIG. 6A to provide a bias voltage. Diodes D2, D7, D8, D9, D10, D11, and D12 are p+/n-well Zener diodes with reasonably well controlled breakdown voltages between 7.8~8.8 V.

Figure 7A:
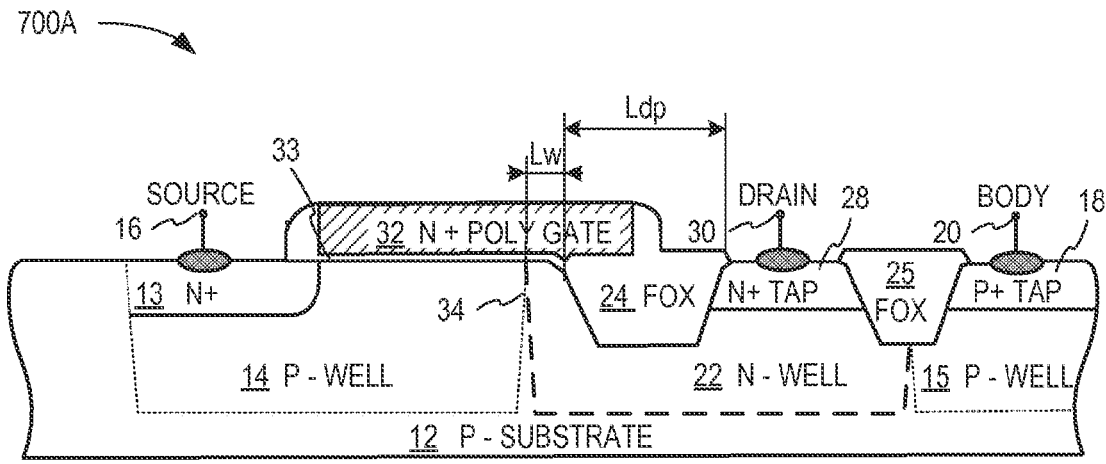
FIG. 7A is a diagram showing a cross-section of a high-voltage laterally diffused transistor according to prior art.

FIG. 7A shows elevational cross-section 700A of a high-voltage laterally diffused transistor according to prior art. An n-well is formed in a lightly doped p-substrate 12. Two n+ doped regions 28 and 13 are disposed in n-well 22 and p-well 14 to form a drain and a source of the transistor, respectively. Drain terminal 30 is coupled to the n+ region 28, and source terminal 16 is coupled to n+ doped region 13. P+ doped region 18 is disposed in p-well 15. Body terminal 20 is coupled to p+ doped region 18. N-well 22 is disposed in p-substrate 12 between p-well 14 and p-well 15. Isolation structure 24 is disposed in n-well 22. Isolation structure 24 is filled with an insulating dielectric material such as silicon dioxide which may be deposited or grown in any convenient manner, such as using the well-known Shallow Trench Isolation (STI) process (as shown), or the well-known Local Oxidation of Silicon (LOCOS) process (not shown). N+ region 28 is disposed in n-well 22. Isolation structure 25 is disposed, at least partially, in n-well 22 and acts to isolate the n+ region 28 from p+ region 18. Dielectric layer 33 is disposed over a portion of p-well 14, the p-well/n-well junction region 34, over a portion of n-well 22, and a portion of trench 24, as illustrated. Gate region 32 is in contact with dielectric layer 33 as well as the dielectric material in trench 24. Gate region 32 may comprise n+ doped polysilicon material, p+ doped polysilicon material, metal, or any other suitable material used for forming a conductive gate. The region denoted Lw is a region of lateral diffusion of n-well 22 under the gate and Lw denotes its length. The region denoted Ldp is the width of isolation structure 24. It provides gate isolation.

Figure 7B:
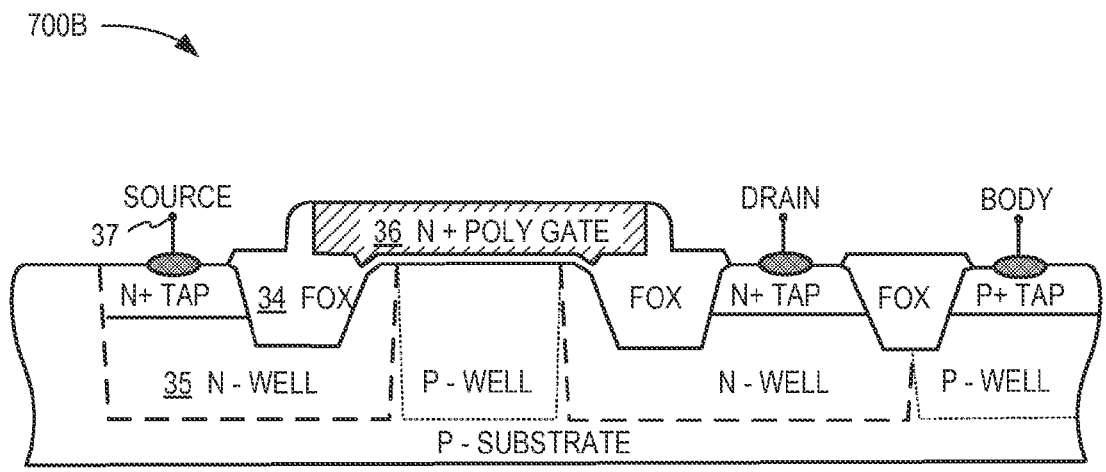
FIG. 7B is a diagram showing a cross-section of a high-voltage symmetrical laterally diffused transistor according to prior art.

FIG. 7B shows elevational cross-section 700B of a high-voltage symmetrical laterally diffused transistor according to prior art.

A structure of the SLDMOS transistor is similar to a structure of the LDMOS transistor. The two structures are different from each other only in a manner in which gate 36 is isolated from source 37. In the LDMOS transistor, only the drain is isolated from the gate, while the SLDMOS transistor has a third isolation structure 34 disposed in n-well 35 to isolate gate 36 from the source 37.

Figure 8A:
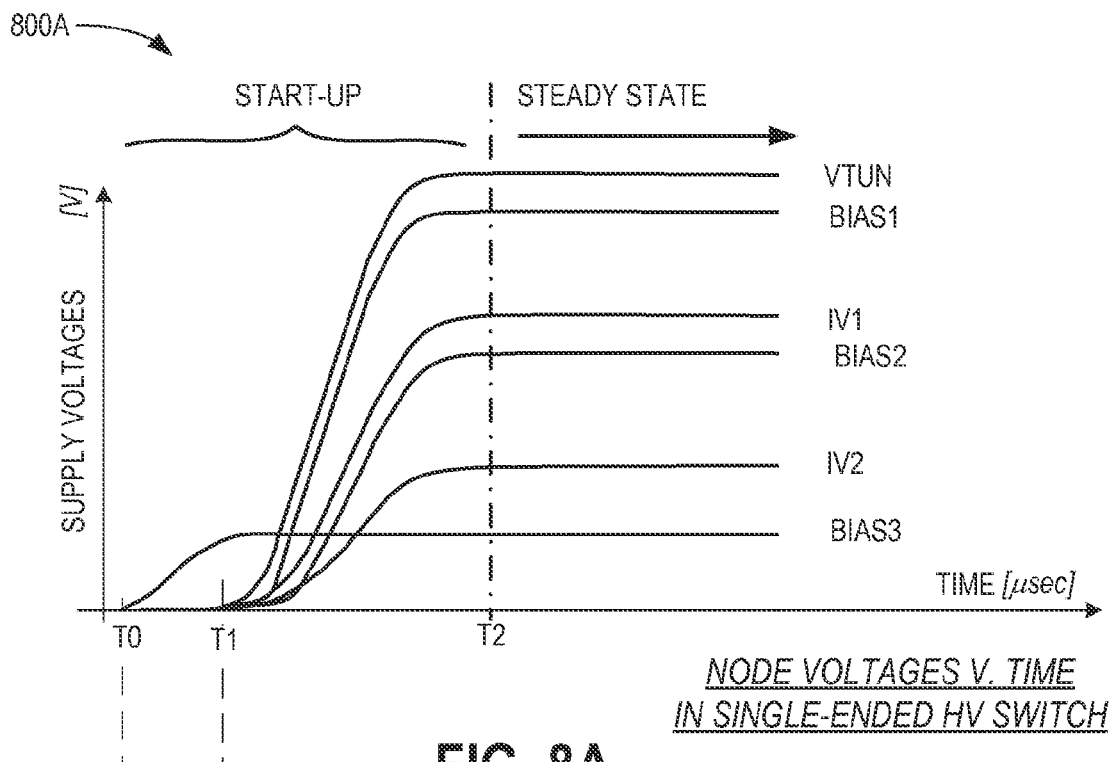
FIG. 8A is a graph showing node voltages as functions of time of the single-ended high-voltage switch of FIGS. 4A and 4B during a start-up phase according to an embodiment.
Figure 8B:
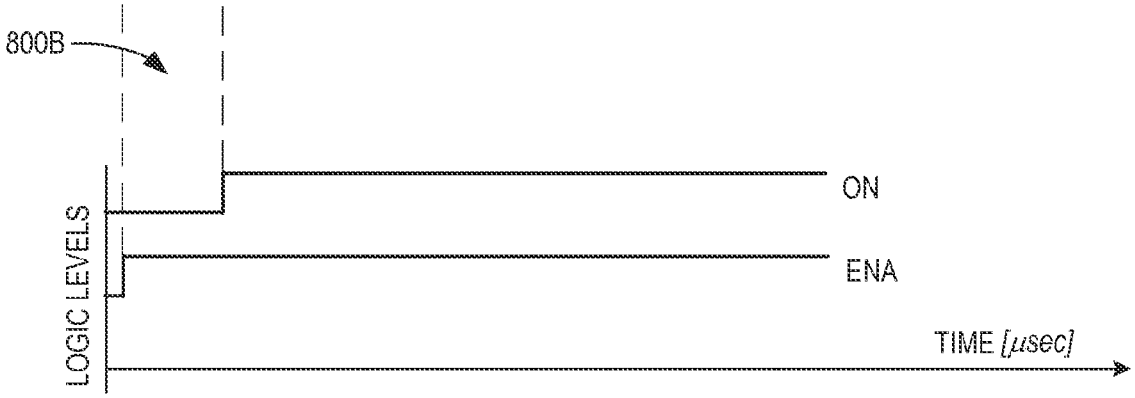
FIG. 8B is a timing diagram showing control timings of the single-ended high-voltage switch of FIGS. 4A and 4B during a start-up phase according to an embodiment.

FIGS. 8A and 8B are graphs 800A and 800B that show node voltages as functions of time in the single-ended HV switch of FIGS. 4A and 4B during a start-up phase according to an embodiment. Graph 800A is divided into two phases: a start-up phase and a steady state phase. The start-up phase triggered by an assertion of control signal ENA at time $t_0$, which causes bias voltage BIAS3 to start rising. At time $t_1$, control signal ON is asserted, which causes bias voltages BIAS1, BIAS2 and supply voltages VTUN, IV1, and IV2 to start rising. By time $t_2$, bias voltages and supply voltages reach their steady state levels and the HV switch is ready for operation.

Figure 8C:
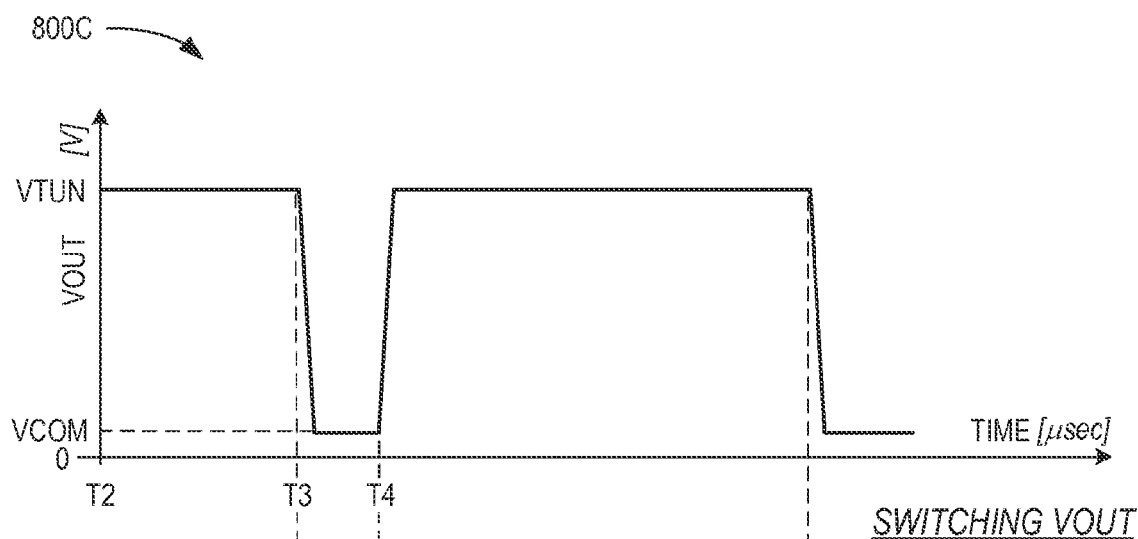
FIG. 8C is a graph showing switching operations of the single-ended high-voltage switch of FIGS. 4A and 4B according to an embodiment.
Figure 8D:
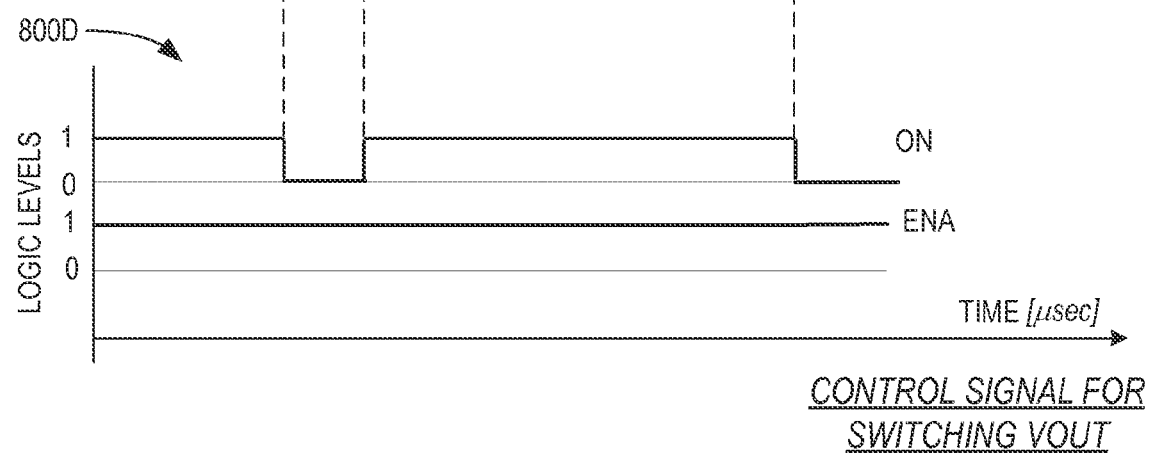
FIG. 8D is a timing diagram showing control timings of the single-ended high-voltage switch of FIGS. 4A and 4B according to an embodiment.

FIGS. 8C and 8D are graphs, which show switching operations of the single-ended HV switch of FIGS. 4A and 4B according to an embodiment. The HV switch circuit provides high-voltage output signal VOUT by switching high supply voltage VTUN in response to logic-level control signal ON. It should be noted that in order to operate the HV switch control signal ENA needs to be asserted. At time $t_2$, output signal VOUT is VTUN, since control signal ON is logic "1" (asserted). At time $t_3$ control signal ON is changed to logic "0" turning the HV switch off, as a result output signal VOUT is changed from VTUN to VCOM. At time $t_4$ control signal ON is changed again from logic "0" to logic "1" turning the HV switch on, as a result output signal VOUT once again becomes VTUN.

Figure 9A:
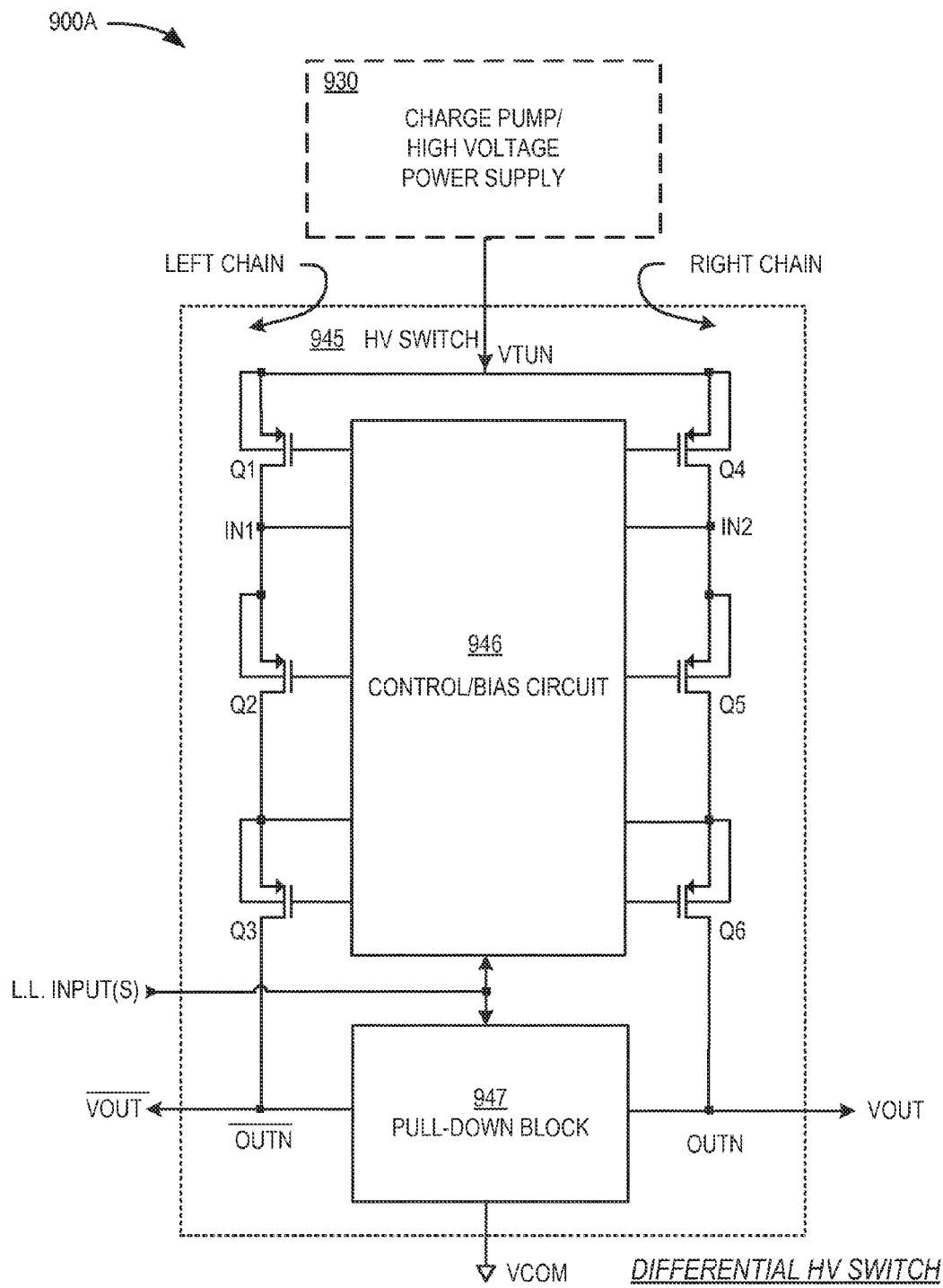
FIG. 9A is a block diagram illustrating a general implementation of a differential high-voltage switch according to embodiments.

FIG. 9A is block diagram 900A that illustrates a general implementation of differential HV switch 945 according to embodiments.

Differential HV switch 945 provides a differentially switched high-voltage signal (VOUT, $\overline{VOUT}$) by switching a high supply voltage in response to at least one logic-level control signal. HV switch 945 includes two coupled chains, a left chain, and a right chain. Each of the chains includes three serially coupled FETs, Q1, Q2, and Q3 for the left chain and Q4, Q5, and Q6 for the right chain. The chains receive high supply voltage VTUN from charge pump/HV power supply 930 and switch it to output the high-voltage output signals VOUT and $\overline{VOUT}$. Control/bias circuit 946 provides control/bias voltages to the chains. Control/bias voltages and their timings are functions of the received logic-level control signals. Pull-down block 947 is coupled to output nodes OUTN and $\overline{OUTN}$ in order to pull them down to VCOM in response to logic-level input signals L. L. INPUT(S).

FIG. 9B is truth table 900B that shows control conditions for differential HV switch 945 of FIG. 9A according to embodiments. Control signal SET is one of the logic-level control signals operating HV switch 945 represented here by L. L. INPUT. As truth table 900B illustrates, HV switch 945 outputs VTUN onto output node $\overline{OUTN}$ and outputs VCOM on output node OUTN when control signal SET is true (logic "1"), and outputs VCOM on output node OUTN and outputs VTUN on output node OUTN when control signal SET is false (logic "0"). It should be noted that HV switch 945 might receive two additional logic-level control signals: reset control signal RST and preset control signal PRESET. Their functions will be described further down in the text.

Figure 10A:
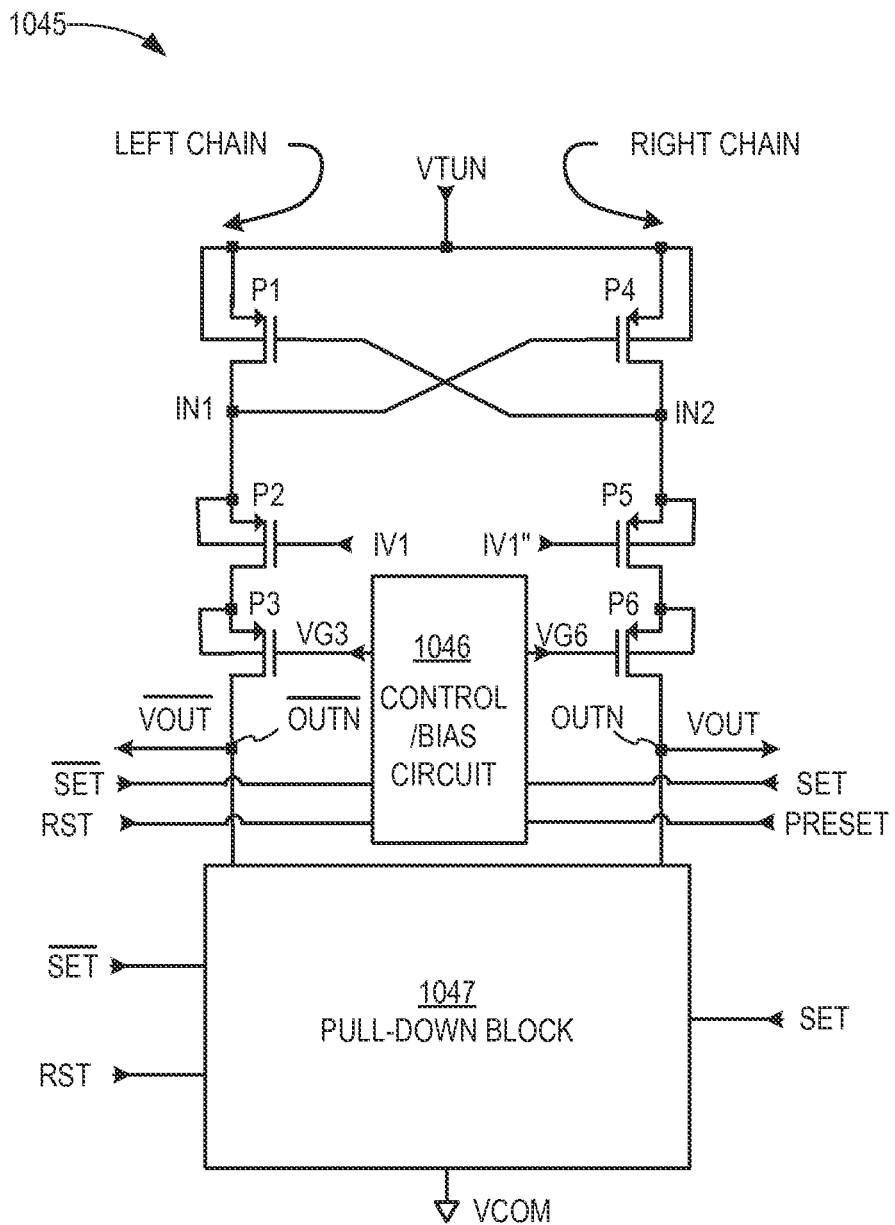
FIG. 10A is an electrical schematic diagram illustrating an implementation of a differential high-voltage switch according to an embodiment.
Figure 10B:
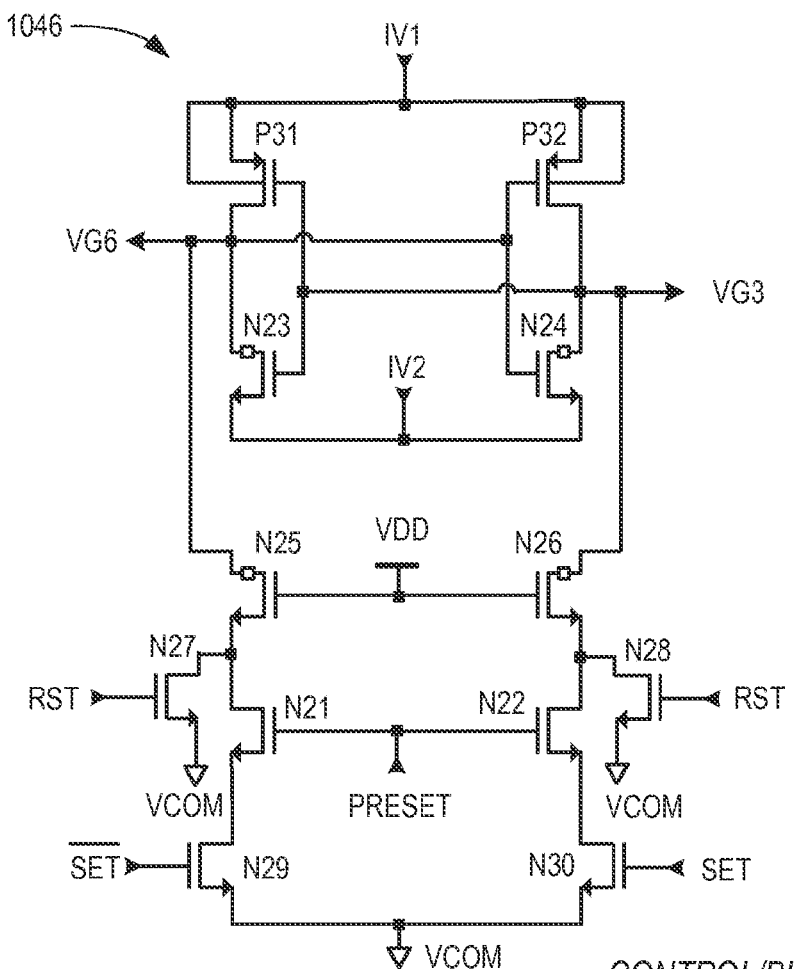
FIG. 10B is an electrical schematic diagram illustrating an implementation of a control/bias circuit for the differential high-voltage switch of FIG. 10A according to an embodiment.
Figure 10C:
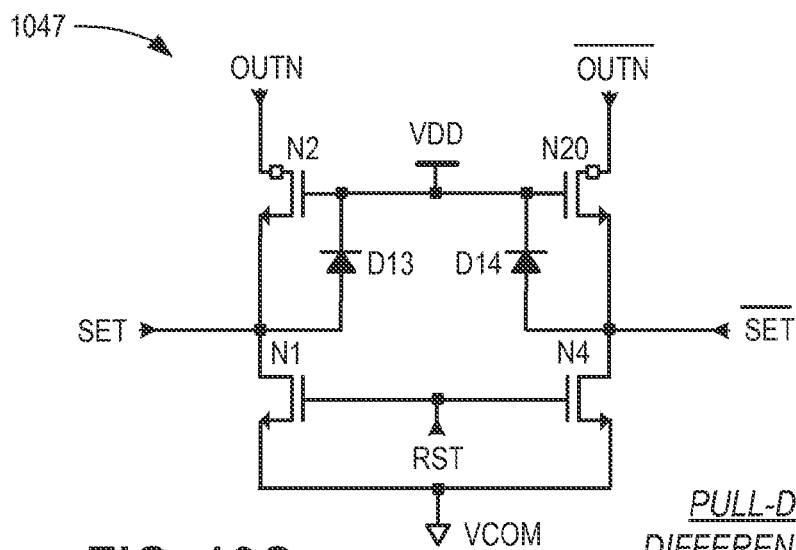
FIG. 10C is an electrical schematic diagram illustrating an implementation of a pull-down block for the differential high-voltage switch of FIG. 10A according to an embodiment.

FIGS. 10A, 10B, and 10C are electrical schematic diagrams that illustrate an implementation of differential HV switch #1 1045 according to an embodiment.

HV switch #1 1045 includes two coupled chains, a left chain, and a right chain, each of the chains includes three serially coupled FETs. Control/bias circuit 1046 provides control/bias voltages to the chains. Pull-down block 1047 is coupled to output nodes OUTN and $\overline{OUTN}$ in order to pull them down to VCOM.

The left chain includes pFET P1, pFET P2, and pFET P3. The right chain includes pFET P4, pFET P5; and pFET P6.

Sources and wells of pFET P1 and pFET P4 are coupled to receive high supply voltage VTUN, a drain of pFET P1 is coupled to first intermediate node IN1 and its gate is coupled to second intermediate node IN2, a drain of pFET P4 is coupled to second intermediate node IN2 and its gate is coupled to first intermediate node IN1.

A source and a well of pFET P2 are coupled to first intermediate node IN1, a gate of pFET P2 is coupled to receive intermediate supply voltage IV1, a source and a well of pFET P5 is coupled to first intermediate node IN2, and a gate of pFET P5 is coupled to receive intermediate supply voltage IV1". Values of intermediate supply voltages IV1 and IV1" may be the same or they can be different from each other.

A source and a well of pFET P3 are coupled to a drain of pFET P2, a gate pFET P3 is coupled to a first circuit portion of control/bias circuit 1046, the first circuit portion provides a first bias voltage that is substantially equal to second intermediate supply voltage IV2 when the control signal SET is true, and provides a second bias voltage that is substantially equal to first intermediate supply voltage IV1 when control signal $\overline{SET}$ is true. A drain of pFET P3 is coupled to output voltage node $\overline{OUTN}$ and provides high-voltage signal $\overline{VOUT}$. A source and a well of pFET P6 is coupled to a drain of pFET P5, a gate pFET P6 is coupled to a second circuit portion of the control/bias circuit 1046, the second circuit portion provides a third bias voltage that is substantially equal to first intermediate supply voltage IV1 when the control signal SET is true, and provides a fourth bias voltage that is substantially equal to second intermediate supply voltage IV2 when control signal $\overline{SET}$ is true, while a drain of pFET P6 is coupled to output voltage node OUTN and provides high-voltage signal VOUT.

To ensure that HV switch #1 1045 latches in the correct direction, it is precharged by setting RST=0, before voltages VTUN and IV1 start to ramp up. A precharge phase can be initiated with either having SET=1 or SET=0.

During the precharge phase when SET=1 and $\overline{SET}$=0, a voltage at intermediate node IN2 is precharged such that its value is higher than the voltage at IN1. As VTUN ramps up, intermediate node IN2 follows VTUN and HV switch #1 1045 latches correctly.

Keeping SET=1 and $\overline{SET}$=0 after the precharge phase, the voltages at IN2 and VOUT continue to follow VTUN, while the voltage at IN1 is substantially IV1.

Alternately, during the precharge phase with SET=0 and $\overline{SET}$=1, the voltage at intermediate node IN1 is precharged such that its value is higher than the voltage at IN2. As VTUN ramps up, intermediate node IN1 follows VTUN and HV switch #1 1045 latches correctly.

Keeping SET=0 and $\overline{SET}$=1 after the precharge phase, the voltages at IN1 and $\overline{VOUT}$ continue to follow VTUN, while the voltage at IN2 is substantially IV1".

FIG. 10B is an electrical schematic diagram illustrating an implementation of control/bias circuit 1046 for differential HV switch #1 1045 of FIG. 10A according to an embodiment. Control/bias circuit 1046 is used to provide bias voltages to pFET P3 and pFET P6. When pFET P3 provides output voltage VTUN, bias voltage VG3 is set to first intermediate supply voltage IV1. When pFET P3 provides output voltage VCOM, bias voltage VG3 is set to second intermediate supply voltage IV2. Similarly, when pFET P6 provides output voltage VTUN, bias voltage VG6 is set to first intermediate supply voltage IV1. When pFET P6 provides output voltage VCOM, VG6 is set to second intermediate supply voltage IV2. Devices N23-N26 are LDMOS devices capable of withstanding high drain voltages. To ensure that control/bias circuit 1046 latches in the correct direction, one of VG3 and VG6 nodes is preset.

FIG. 10C is an electrical schematic diagram illustrating an implementation of a pull-down block 1047 for differential HV switch #1 1045 according to an embodiment. Pull-down block 1047 is coupled to output nodes OUTN/$\overline{OUTN}$ in order to pull down VOUT/$\overline{VOUT}$ to VCOM in response to control signal $\overline{SET}$/SET.

Pull-down block 1047 includes two circuit portions. A left-side portion includes nFET N1, LDMOS N2 and diode D13 and a right-side portion includes nFET N4, LDMOS N20 and diode D14. LDMOS N2 has its drain coupled to output node OUTN, and its gate coupled to receive VDD. nFET N1 has its drain coupled to a source of LDMOS N2, its gate coupled to receive control signal RST and its source coupled to receive supply voltage VCOM. Diode D13 has its cathode coupled to the gate of LDMOS N2. Control signal SET is coupled to the source of LDMOS N2 to control operation of the left-side of pull-down block 1047.

Control signal $\overline{SET}$ controls the operation of the right-side of pull-down block 1047.

Figure 11A:
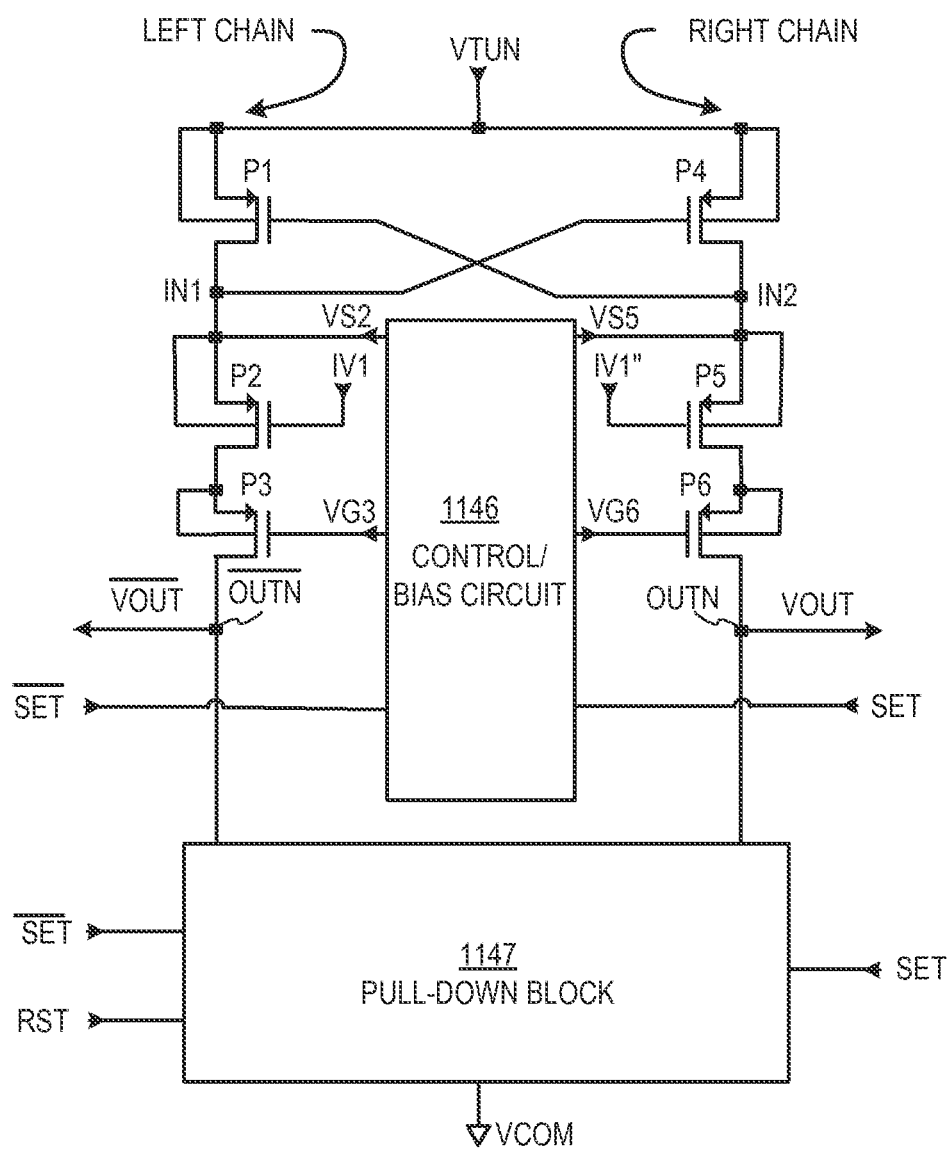
FIG. 11A is an electrical schematic diagram illustrating another implementation of a differential high-voltage switch according to an embodiment.
Figure 11B:
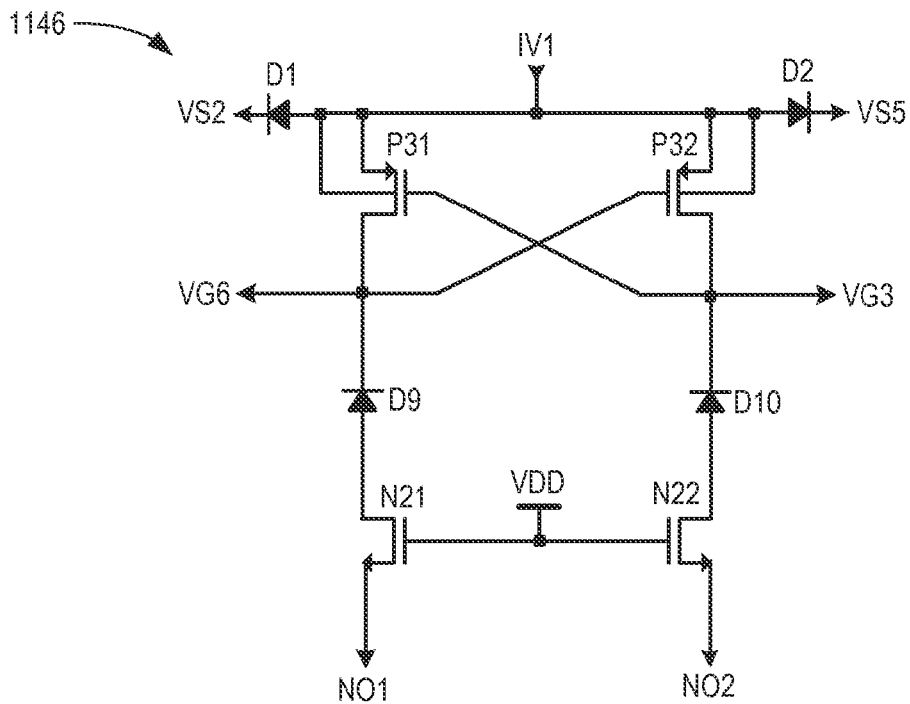
FIG. 11B is an electrical schematic diagram illustrating an implementation of a control/bias circuit for the differential high-voltage switch of FIG. 11A according to an embodiment.
Figure 11C:
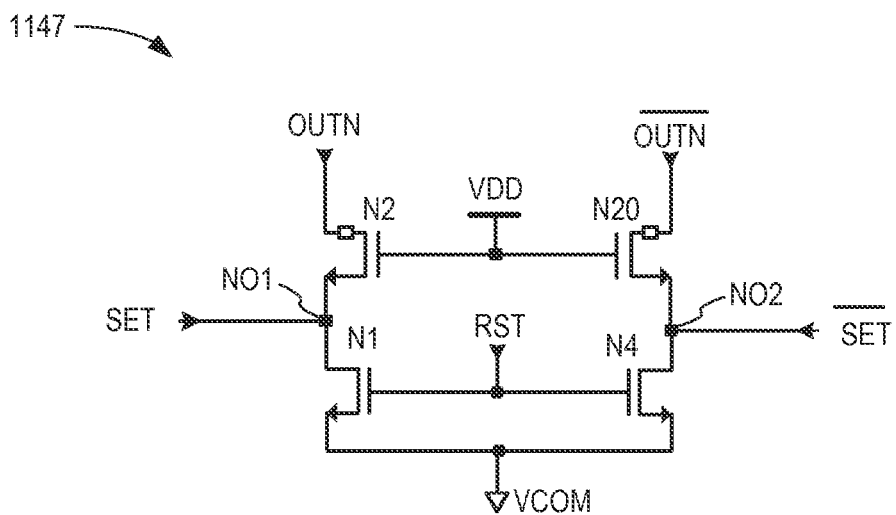
FIG. 11C is an electrical schematic diagram illustrating an implementation of a pull-down block for the differential high-voltage switch of FIG. 11A according to an embodiment.

FIGS. 11A, 11B, and 11C are electrical schematic diagrams that illustrate implementations of differential HV switch #2 1145 according to an embodiment.

HV switch #2 1145 is substantially the same as HV switch #1 1045 of FIGS. 10A-C. HV switch #2 is different from HV switch #1 in how control/bias circuit 1146 and pull-down block 1147 are implemented.

Control/bias circuit 1146 includes two differentially coupled chains, a left and a right chain, forming a latch. Each chain is configured mostly from serially coupled FETs. The chains receive first intermediate supply voltage IV1 and produce bias voltages. Control/bias circuit 1146 operates under the control signals, i.e., SET, $\overline{SET}$ and RST.

The left chain includes pFET P31, a source and a well of pFET P31 are coupled to receive the first intermediate supply voltage IV1, and its gate is coupled to the drain of pFET P32 in the right chain. Diode D9 is disposed between pFET P31 and nFET N21. Diode D9 has its cathode coupled to a drain of pFET P31 and it is also coupled to a gate of pFET P6 of FIG. 1A to provide bias voltage VG6. nFET N21 has its drain coupled to an anode of diode D9, and its gate is coupled to receive a voltage from voltage supply VDD. nFET N1 has its drain coupled to a source of nFET N21 at node NO1. Diode D1 has its anode coupled to receive the first intermediate supply voltage IV1 and its cathode coupled to a source of pFET P2 of FIG. 11A.

The right chain includes pFET P32, a source and a well of pFET P32 are coupled to receive the first intermediate supply voltage IV1, and its gate is coupled to a drain of pFET P31 in the left chain. Diode D10 is disposed between pFET P32 and nFET N22. Diode D10 has its cathode coupled to the drain of pFET P32 and it is also coupled to a gate of pFET P3 of FIG. 11A to provide bias voltage VG3. nFET N22 has its drain coupled to an anode of diode D10, and its gate coupled to receive a voltage from voltage supply VDD. nFET N4 has its drain coupled to a source of nFET N22 at node NO2 and it is also coupled to receive control signal $\overline{SET}$. A gate of nFET N4 is coupled to receive control signal RST, and a source of nFET N4 is coupled to VCOM. Diode D2 has its anode coupled to receive the first intermediate supply voltage IV1 and its cathode coupled to a source of pFET P5 of FIG. 11A.

FIG. 11C is an electrical schematic diagram illustrating an implementation of pull-down block 1147 for the differential HV switch #2 1145 according to an embodiment. Pull-down block 1147 includes two circuit portions. A left-side portion includes LDMOS N2, and a right-side portion includes LDMOS N20. LDMOS N2 has its drain coupled to output node OUTN, its gate is coupled VDD and a source of LDMOS N2 is coupled to node NO1, and it is also coupled to receive control signal SET. A gate of nFET N1 is coupled to receive control signal RST, and a source of nFET N1 is coupled to VCOM. LDMOS N20 has its drain coupled to output node $\overline{OUTN}$, its gate coupled to voltage supply VDD, and its source coupled to node NO2 of FIG. 11B.

Figure 12A:
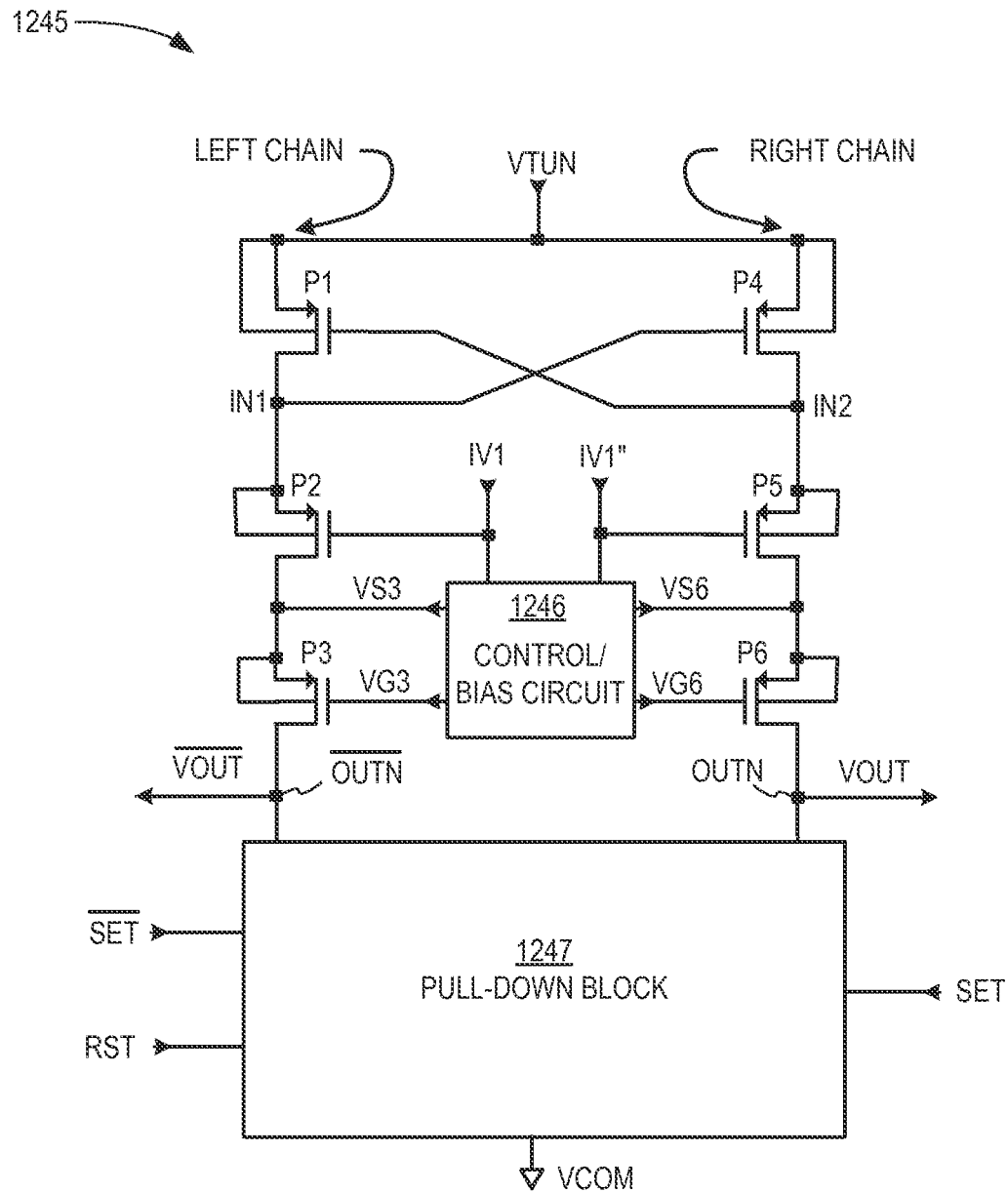
FIG. 12A is an electrical schematic diagram illustrating still another implementation of a differential high-voltage switch according to an embodiment.
Figure 12B:
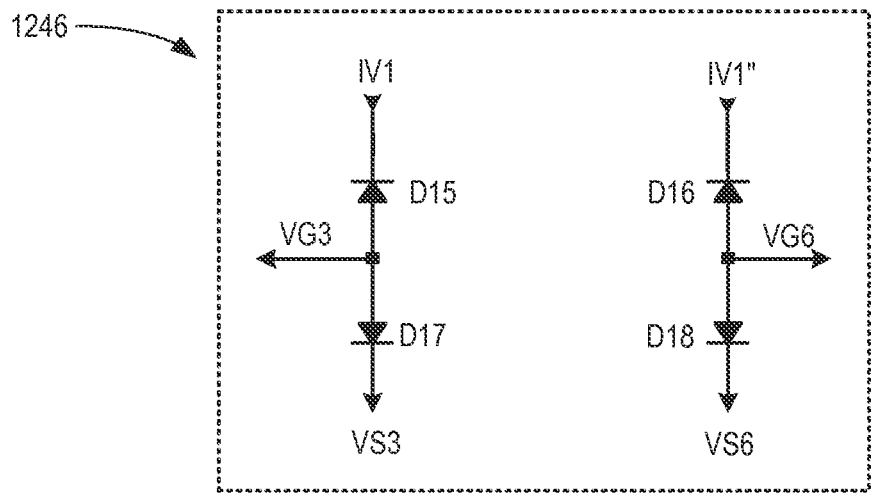
FIG. 12B is an electrical schematic diagram illustrating an implementation of a control/bias circuit for the differential high-voltage switch of FIG. 12A according to an embodiment.
Figure 12C:
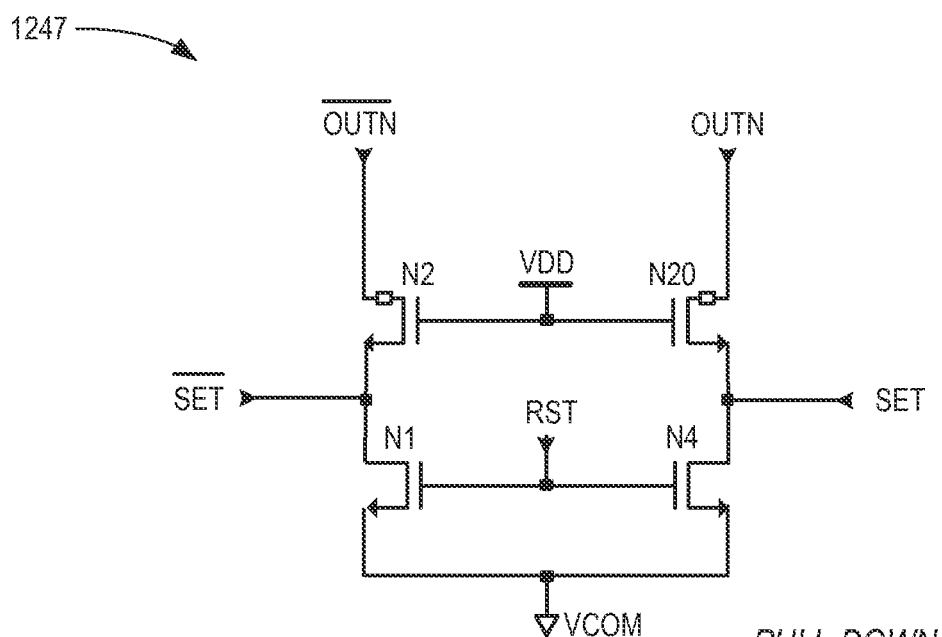
FIG. 12C is an electrical schematic diagram illustrating an implementation of a pull-down block for the differential high-voltage switch of FIG. 12A according to an embodiment.

FIGS. 12A, 12B, and 12C are electrical schematic diagrams that illustrate implementations of differential HV switch #3 1245 according to an embodiment. HV switch #3 1245 is substantially the same as HV switch #1 1045 of FIG. 10A and HV switch #2 1145 of FIG. 11A. HV switch #3 1245 is different from HV switch #1 1045 and HV switch #2 1145 in how control/bias circuit 1246 and pull-down block 1247 are implemented.

Control/bias circuit 1246 includes four diodes, diodes D15, D16, D17, and D18. Diode D15 has its cathode coupled to receive first intermediate supply voltage IV1 and its anode coupled to the gate of pFET P3 of FIG. 12A to provide bias voltage VG3. Diode D17 has its anode coupled to the anode of diode D15 and its cathode coupled to the source of pFET P3 to provide bias voltage VS3. Diode D16 has its cathode coupled to receive first intermediate supply voltage IV1 and its anode coupled to the gate of pFET P6 of FIG. 12A to provide bias voltage VG6. Diode D18 has its anode coupled to the anode of diode D16 and its cathode coupled to the source of pFET P6 to provide bias voltage VS6.

Pull-down block 1247 is substantially the same as pull-down block 1047 of FIG. 10C with the exceptions that diodes D13 and D14 of pull-down block 1047 are absent from pull-down block 1247.

Figure 13A:
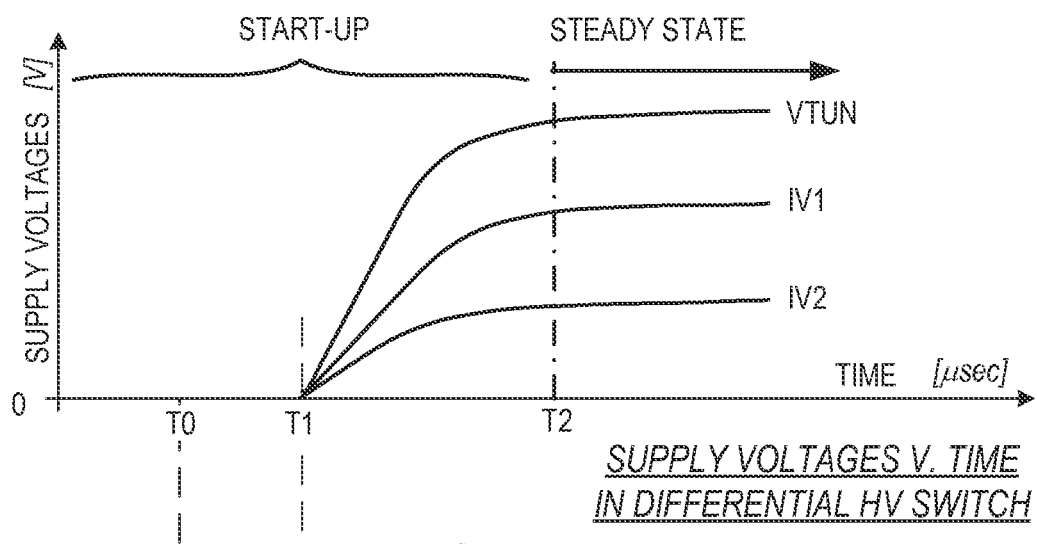
FIG. 13A is a graph showing node voltages as functions of time in the differential high-voltage switch of FIGS. 10A-C according to an embodiment.
Figure 13B:
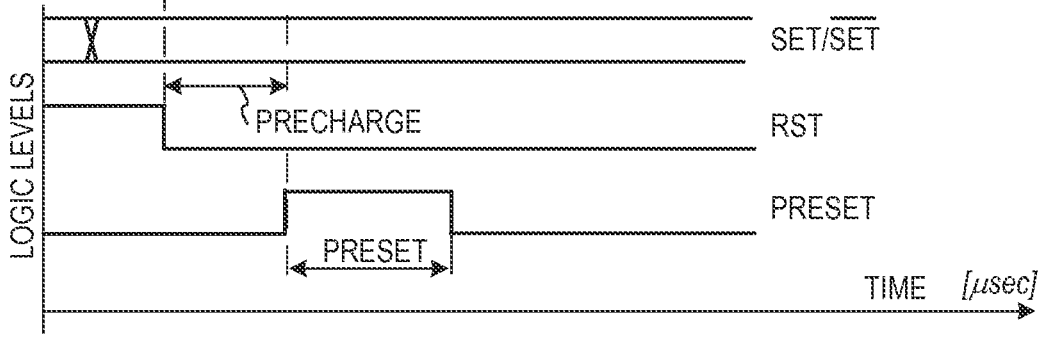
FIG. 13B is a timing diagram showing timing relationships among control signals for the differential high-voltage switch of FIGS. 10A-C according to an embodiment.

FIGS. 13A and 13B are graphs 1300A and 1300B that show node voltages as functions of time for the differential HV switch #1 1045 of FIGS. 10A and 10B during a start-up phase according to an embodiment. Graph 1300A is divided into two phases: a start-up phase and a steady state phase. The start-up phase is triggered by an assertion of control signal RST at time t0. At time t1 control signal PRESET is asserted as supply voltages VTUN, IV1, and IV2 start rising. By time t₂, bias voltages and supply voltages reach their steady state levels, HV switch #1 1045 is ready for operation.

Numerous details have been set forth in this description, which is to be taken as a whole, to provide a more thorough understanding of the invention. In other instances, well-known features have not been described in detail, so as to not obscure unnecessarily the invention.

The invention includes combinations and subcombinations of the various elements, features, functions and/or properties disclosed herein. The following claims define certain combinations and subcombinations, which are regarded as novel and non-obvious. Additional claims for other combinations and subcombinations of features, functions, elements, and/or properties may be presented in this or a related document.

What is claimed:

1. A switch circuit comprising:
   a chain of at least three serially coupled field effect transistors (FETs), the chain of FETs coupled between a high-voltage supply and an output node, the chain of FETs turned on or off responsive to a control voltage to couple the high-voltage supply to the output node for outputting a high-voltage output signal;
   a control/bias circuit for providing the control voltage to turn on or off at least a first FET in the chain of FETs responsive to a control signal; and
   a pull-down circuit block having a first FET coupled between a low-voltage supply and the output node, a gate of the first FET coupled to receive a complement of the control signal, the first FET of the pull-down circuit block turned on or off responsive to the control signal to couple the low-voltage supply to the output node for outputting a low-voltage output signal.

2. The circuit of claim 1, further comprising:
   a first diode having an anode and a cathode, the anode coupled between the first FET of the pull-down circuit block and a second FET of the pull-down circuit block to receive the compliment of the control signal, the cathode coupled to the gate of the first FET.

3. The circuit of claim 2, wherein the first diode is an FET configured as a diode.

4. The circuit of claim 1, further comprising:
   a second chain of FETs turned on or off responsive to a second control voltage to couple the high-voltage supply to a second output node for outputting a second high-voltage output signal;
   the control/bias circuit providing the second control voltage to turn on or off at least a first FET in the second chain of at least three serially coupled FETs responsive to the compliment of the control signal; and
   the pull-down circuit block having a second FET coupled between the low-voltage supply and the second output node, a gate of the second FET coupled to receive the control signal, the second FET of the pull-down circuit block turned on or off responsive to the control signal to couple the low-voltage supply to the second output node for outputting the low-voltage output signal.

5. The circuit of claim 4, wherein the first chain and the second chain are differentially coupled, a gate of a second FET in the first chain coupled to a source of a second FET in the second chain and a gate of the second FET in the second chain coupled to a source of the second FET in the first chain.

6. The circuit of claim 5, wherein the second FET in the first chain is coupled between the high voltage supply and the first FET in the first chain, and the second FET in the second chain is coupled between the high voltage supply and the first FET in the second chain.

7. The circuit of claim 4, further comprising:
   a second diode having an anode and a cathode, the anode coupled between the second FET of the pull-down circuit block and a third FET of the pull-down circuit block to receive the control signal, the cathode coupled to the gate of the second FET.

8. The circuit of claim 7, wherein the second diode is an FET configured as a diode.

9. An article of manufacture comprising:
   a chain of at least three serially coupled field effect transistors (FETs), the chain FETs coupled between a high-voltage supply and an output node, the chain of FETs turned on or off responsive to a control voltage to couple the high-voltage supply to the output node for outputting a high-voltage output signal;
   a control/bias circuit for providing the control voltage to turn on or off at least a first FET in the chain of FETs responsive to a control signal; and
   a pull-down circuit block having a first FET coupled between a low-voltage supply and the output node, a gate of the first FET coupled to receive a complement of the control signal, the first FET of the pull-down circuit block turned on or off responsive to the control signal to couple the low-voltage supply to the output node for outputting a low-voltage output signal.

10. The article of manufacture of claim 9, further comprising:
    a first diode having an anode and a cathode, the anode coupled between the first FET of the pull-down circuit block and a second FET of the pull-down circuit block to receive the compliment of the control signal, the cathode coupled to the gate of the first FET.

11. The article of manufacture of claim 10, wherein the first diode is an FET configured as a diode.

12. The article of manufacture of claim 9, further comprising:
    a second chain of FETs turned on or off responsive to a second control voltage to couple the high-voltage supply to a second output node for outputting a second high-voltage output signal;
    the control/bias circuit providing the second control voltage to turn on or off at least a first FET in the second chain of at least three serially coupled FETs responsive to the compliment of the control signal; and
    the pull-down circuit block having a second FET coupled between the low-voltage supply and the second output node, a gate of the second FET coupled to receive the control signal, the second FET of the pull-down circuit block turned on or off responsive to the control signal to couple the low-voltage supply to the second output node for outputting the low-voltage output signal.

13. The article of manufacture of claim 12, wherein the first chain and the second chain are differentially coupled, a gate of a second FET in the first chain coupled to a source of a second FET in the second chain and a gate of the second FET in the second chain coupled to a source of the second FET in the first chain.

14. The article of manufacture of claim 13, wherein the second FET in the first chain is coupled between the high voltage supply and the first FET in the first chain, and the second FET in the second chain is coupled between the high voltage supply and the first FET in the second chain.

15. The article of manufacture of claim 14, further comprising:
    a second diode having an anode and a cathode, the anode coupled between the second FET of the pull-down circuit block and a third FET of the pull-down circuit block to receive the control signal, the cathode coupled to the gate of the second FET.

16. The article of manufacture of claim 15, wherein the second diode is an FET configured as a diode.

17. A method comprising:
receiving a control signal at:
  a control/bias circuit for providing control voltages to at least one field effect transistor (FET) in a chain of at least three serially coupled FETs, the chain of FETs coupled between a high voltage source and an output node, and
  at least one FET of a pull-down block, the pull-down block coupled between a low voltage source and the output node;
generating a first control voltage at a gate of a first FET in the chain of FETs in response to the control signal, the first FET in the chain of FETs turning on or off in response to the first control voltage to couple or decouple the high voltage source and the output node;
generating a second control voltage at a gate of a first FET of the pull-down block in response to a compliment of the control signal, the first FET of the pull-down block turning on or off in response to the second control voltage to couple or decouple the low voltage source and the output node; and
switching, in response to the control signal, an output voltage at the output node from a high voltage output to a low voltage output or from the low voltage output to the high voltage output.

18. The method of claim 17, wherein the chain of FETs includes a second FET coupled between the high voltage source and the first FET in the chain, the second FET having a gate coupled to receive a differential input voltage from a second chain of serially coupled FETs.

19. The method of claim 18, wherein the chain includes a third FET coupled between the second FET in the chain and the first FET in the chain, the third FET having a gate coupled to receive a bias voltage.

* * * * *